(12) United States Patent
Yamazaki et al.

(10) Patent No.: US 11,784,259 B2
(45) Date of Patent: Oct. 10, 2023

(54) OXIDE SEMICONDUCTOR DEVICE

(71) Applicant: Semiconductor Energy Laboratory Co., Ltd., Atsugi (JP)

(72) Inventors: Shunpei Yamazaki, Setagaya (JP); Hiromi Sawai, Atsugi (JP); Ryo Tokumaru, Isehara (JP); Toshihiko Takeuchi, Atsugi (JP); Tsutomu Murakawa, Isehara (JP); Sho Nagamatsu, Isehara (JP); Tomoaki Moriwaka, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/697,152

(22) Filed: Mar. 17, 2022

(65) Prior Publication Data

US 2022/0336670 A1    Oct. 20, 2022

Related U.S. Application Data

(63) Continuation of application No. 16/760,050, filed as application No. PCT/IB2018/059278 on Nov. 26, 2018.

(30) Foreign Application Priority Data

Dec. 7, 2017    (JP) ................................ 2017-235307
Feb. 23, 2018    (JP) ................................ 2018-030371

(51) Int. Cl.
*H01L 29/00*    (2006.01)
*H01L 27/00*    (2006.01)
(Continued)

(52) U.S. Cl.
CPC .......... *H01L 29/7869* (2013.01); *H01L 29/04* (2013.01); *H01L 29/0665* (2013.01);
(Continued)

(58) Field of Classification Search
CPC ......... H01L 27/10814; H01L 27/10873; H01L 27/108; H01L 27/1156; H01L 29/7869;
(Continued)

(56) References Cited

U.S. PATENT DOCUMENTS 5,656,349 A    8/1997    Gomi et al.
7,674,650 B2    3/2010    Akimoto et al.
(Continued)

FOREIGN PATENT DOCUMENTS

CN    101506985 A    8/2009
CN    102694006 A    9/2012
(Continued)

OTHER PUBLICATIONS

International Search Report (Application No. PCT/IB2018/059278) dated Mar. 12, 2019.
(Continued)

*Primary Examiner* — Nikolay K Yushin
(74) *Attorney, Agent, or Firm* — ROBINSON INTELLECTUAL PROPERTY LAW OFFICE; Eric J. Robinson

(57) ABSTRACT

A semiconductor device having favorable electrical characteristics is provided. The semiconductor device includes a conductor, a first insulator in contact with a side surface of the conductor, a second insulator in contact with a top surface of the conductor and a top surface of the first insulator, and an oxide over the second insulator. The oxide includes a region that overlaps with the conductor with the second insulator interposed therebetween. The maximum height of a roughness curve (Rz) of the top surface of the conductor is 6.0 nm or smaller. The region includes crystals, and c-axes of the crystals are aligned in the normal direction of the top surface of the conductor.

6 Claims, 13 Drawing Sheets

(51) Int. Cl.
  *H01L 29/786* (2006.01)
  *H01L 29/04* (2006.01)
  *H01L 29/06* (2006.01)
  *H01L 29/66* (2006.01)
  *H10B 12/00* (2023.01)
(52) U.S. Cl.
  CPC ....... *H01L 29/66742* (2013.01); *H10B 12/05* (2023.02); *H10B 12/315* (2023.02)
(58) Field of Classification Search
  CPC .............. H01L 29/04; H01L 29/0665; H01L 29/66742; H01L 21/28; H01L 21/8221; H01L 21/31116; H01L 21/8234; H01L 27/1207; H01L 27/105; H01L 27/088; H01L 29/78648; H10B 12/05; H10B 12/315; H10B 12/30; H10B 12/00; H10B 41/70
  See application file for complete search history.

(56) References Cited

U.S. PATENT DOCUMENTS

| | | | |
|---|---|---|---|
| 8,492,758 | B2 | 7/2013 | Yamazaki et al. |
| 8,581,243 | B2 | 11/2013 | Takahashi et al. |
| 8,653,520 | B2 | 2/2014 | Yamazaki et al. |
| 8,664,118 | B2 | 3/2014 | Ishizuka et al. |
| 8,664,653 | B2 | 3/2014 | Yamazaki et al. |
| 8,680,679 | B2 | 3/2014 | Godo et al. |
| 8,766,329 | B2 | 7/2014 | Endo et al. |
| 8,796,681 | B2 | 8/2014 | Yamade et al. |
| 8,816,338 | B2 | 8/2014 | Matsuura et al. |
| 8,888,347 | B2 | 11/2014 | Yokota et al. |
| 8,987,728 | B2 | 3/2015 | Honda et al. |
| 9,299,852 | B2 | 3/2016 | Yoshioka et al. |
| 9,490,351 | B2 | 11/2016 | Honda et al. |
| 9,917,109 | B2 | 3/2018 | Fujii et al. |
| 2009/0278134 | A1 | 11/2009 | Ohmi et al. |
| 2010/0059751 | A1 | 3/2010 | Takahashi et al. |
| 2012/0257410 | A1 | 10/2012 | Yokota et al. |
| 2013/0048976 | A1 | 2/2013 | Matsuura et al. |
| 2015/0179777 | A1 | 6/2015 | Honda et al. |

FOREIGN PATENT DOCUMENTS

| | | |
|---|---|---|
| EP | 0464786 A | 1/1992 |
| EP | 2088629 A | 8/2009 |
| EP | 2503597 A | 9/2012 |
| JP | 2008-103653 A | 5/2008 |
| JP | 2009-194351 A | 8/2009 |
| JP | 2012-216797 A | 11/2012 |
| JP | 2016-201518 A | 12/2016 |
| KR | 10-0229690 | 11/1999 |
| KR | 2009-0071538 A | 7/2009 |
| KR | 2012-0109347 A | 10/2012 |
| KR | 2012-0109494 A | 10/2012 |
| TW | 200832718 | 8/2008 |
| TW | 200908334 | 2/2009 |
| TW | 201301523 | 1/2013 |
| WO | WO-2008/035786 | 3/2008 |
| WO | WO-2008/139859 | 11/2008 |

OTHER PUBLICATIONS

Written Opinion (Application No. PCT/IB2018/059278) dated Mar. 12, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

OXIDE SEMICONDUCTOR DEVICE

TECHNICAL FIELD

One embodiment of the present invention relates to a semiconductor device and a method for manufacturing the semiconductor device. One embodiment of the present invention also relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device is an embodiment of a semiconductor device. A display device (a liquid crystal display device, a light-emitting display device, and the like), a projection device, a lighting device, an electro-optical device, a power storage device, a memory device, a semiconductor circuit, an imaging device, an electronic device, and the like can be sometimes said to include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

A silicon-based semiconductor material is widely known as a semiconductor thin film that can be used in a transistor; and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are neither single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor using IGZO for an active layer has an extremely low off-state current (see Non-Patent Document 6), and an LSI and a display utilizing the characteristics have been reported (see Non-Patent Document 7 and Non-Patent Document 8).

REFERENCES

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device with a high on-state current. Another object of one embodiment of the present invention is to provide a semiconductor device having high frequency characteristics. Another object of one embodiment of the present invention is to provide a highly reliable semiconductor device. Another object of one embodiment of the present invention is to provide a semiconductor device that can be scaled down or highly integrated. Another object of one embodiment of the present invention is to provide a semiconductor device having favorable electrical characteristics. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device with high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the descriptions of the objects do not preclude the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a semiconductor device including a conductor, a first insulator in contact with a side surface of the conductor, a second insulator in contact with a top surface of the conductor and a top surface of the first insulator, and an oxide over the second insulator. The oxide includes a region that overlaps with the conductor with the second insulator interposed therebetween. The maximum height of a roughness curve (Rz) of the top surface of the conductor is 6.0 nm or smaller.

The region includes crystals, and c-axes of the crystals are aligned in the normal direction of the top surface of the conductor.

In the description above, the mean length of roughness curve components (RSm) of the top surface of the conductor is preferably smaller than 60 nm.

One embodiment of the present invention is a semiconductor device including a conductor, a first insulator in contact with a side surface of the conductor, a second insulator in contact with a top surface of the conductor and a top surface of the first insulator, and an oxide over the second insulator. The oxide includes a region that overlaps with the conductor with the second insulator interposed therebetween. The mean length of roughness curve components (RSm) of the top surface of the conductor is 60 nm or larger. The region includes crystals, and c-axes of the crystals are aligned in the normal direction of the top surface of the conductor.

In the description above, the maximum height of a roughness curve (Rz) of the top surface of the conductor is preferably larger than 6.0 nm.

One embodiment of the present invention is a semiconductor device including a conductor, a first insulator in contact with a side surface of the conductor, a second insulator in contact with a top surface of the conductor and a top surface of the first insulator, and an oxide over the second insulator. The oxide includes a region that overlaps with the conductor with the second insulator interposed therebetween. The arithmetical mean height of roughness curves (Ra) of the top surface of the conductor is 0.5 nm or smaller. The region includes crystals, and c-axes of the crystals are aligned in the normal direction of the top surface of the conductor.

In the description above, the oxide preferably includes indium (In), an element M (M is aluminum (Al), gallium (Ga), yttrium (Y), or tin (Sn)), zinc (Zn) and oxygen.

Effects of the Invention

With one embodiment of the present invention, a semiconductor device with a high on-state current can be provided. With one embodiment of the present invention, a semiconductor device having high frequency characteristics can be provided. According to one embodiment of the present invention, a highly reliable semiconductor device can be provided. With one embodiment of the present invention, a semiconductor device that can be scaled down or highly integrated can be provided. With one embodiment of the present invention, a semiconductor device having favorable electrical characteristics can be provided. With one embodiment of the present invention, a semiconductor device with high productivity can be provided.

A semiconductor device capable of retaining data for a long time can be provided. A semiconductor device with high-speed data writing can be provided. A semiconductor device with high design flexibility can be provided. A semiconductor device capable of reducing power consumption can be provided. A novel semiconductor device can be provided.

Note that the descriptions of the effects do not preclude the existence of other effects. One embodiment of the present invention does not have to include all the effects. Other effects will be apparent from and can be derived from the description of the specification, the drawings, the claims, and the like.

BRIEF DESCRIPTION OF THE DRAWINGS

FIGS. 12A-12F Diagrams illustrating electronic devices of one embodiment of the present invention.

MODE FOR CARRYING OUT THE INVENTION

Figure 1A:
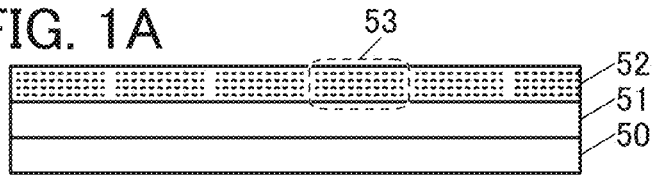
FIGS. 1A-1E Diagrams describing shapes of films of one embodiment of the present invention.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the illustrated scale. Note that the drawings are ideal examples shown schematically, and shapes or values are not limited to those shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used in different drawings for the same portions or portions having similar functions, and repeated description thereof is omitted in some cases. Furthermore, the same hatch pattern is used for the portions having similar functions, and the portions are not specifically denoted by reference numerals in some cases.

Particularly in a top view (also referred to as a "plan view"), a perspective view, or the like, the description of some components might be omitted for easy understanding of the invention. In addition, the description of some hidden lines and the like might be omitted.

In this specification and the like, ordinal numbers such as first and second are used for convenience and do not denote the order of steps or the stacking order of layers. Therefore, for example, a description can be made in replacing "first" with "second", "third", or the like as appropriate. In addition, the ordinal numbers in this specification and the like are not necessarily the same as those used for specifying one embodiment of the present invention.

In this specification and the like, the terms for explaining arrangement, such as "over" and "under", are used for convenience to describe the positional relation between components with reference to the drawings. Furthermore, the positional relation between components is changed as appropriate in accordance with a direction in which each component is described. Thus, without limitation to terms described in this specification, the description can be rephrased appropriately depending on the situation.

In this specification and the like, in the case where there is an explicit description that X and Y are connected, for example, the case where X and Y are electrically connected, the case where X and Y are functionally connected, and the case where X and Y are directly connected are regarded as being disclosed in this specification and the like. Accordingly, a connection relation other than the one shown in drawings or texts, as well as a connection relation shown in the drawings or the texts such as a predetermined connection relation are regarded as being disclosed in the drawings or the texts.

Here, X and Y denote an object (for example, a device, an element, a circuit, a wiring, an electrode, a terminal, a conductive film, or a layer).

Furthermore, functions of a source and a drain might be switched when a transistor of different polarity is employed or a direction of current is changed in circuit operation, for example. Therefore, the terms source and drain can sometimes be used interchangeably in this specification and the like.

Note that in this specification and the like, depending on transistor structures, a channel width in a region where a channel is actually formed (hereinafter also referred to as "an effective channel width") is different from a channel width shown in a top view of a transistor (hereinafter also referred to as "an apparent channel width") in some cases. For example, when a gate electrode covers a side surface of a semiconductor, an effective channel width is larger than an apparent channel width, and its influence cannot be ignored in some cases. For example, in a scaled down transistor including a gate electrode covering a side surface of a semiconductor, the proportion of a channel formation region formed at the side surface of the semiconductor is increased in some cases. In that case, an effective channel width is larger than an apparent channel width.

In such a case, an effective channel width is difficult to estimate by actual measurement in some cases. For example, estimation of an effective channel width from a design value requires an assumption that the shape of a semiconductor is already known. Accordingly, in the case where the shape of a semiconductor is not accurately known, it is difficult to measure an effective channel width accurately.

In this specification, when channel width is simply mentioned, it refers to an apparent channel width in some cases. Alternatively, in this specification, when channel width is simply mentioned, it refers to an effective channel width in some cases. Note that values of a channel length, a channel width, an effective channel width, an apparent channel width, and the like can be determined, for example, by analyzing a cross-sectional TEM image or the like.

Note that impurities in a semiconductor refer to, for example, elements other than the main components of the semiconductor. For example, an element with a concentration of lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than the main components of the oxide semiconductor, and the like; hydrogen, lithium, sodium, silicon, boron, phosphorus, carbon, nitrogen, and the like are given as examples. In the case of an oxide semiconductor, water also serves as an impurity in some cases. Also in the case of an oxide semiconductor, oxygen vacancies are formed by entry of impurities, for example. Furthermore, in the case where the semiconductor is silicon, examples of an impurity that changes the characteristics of the semiconductor include oxygen, Group 1 elements except hydrogen, Group 2 elements, Group 13 elements, Group 15 elements, and the like.

In this specification and the like, a silicon oxynitride has a higher amount of oxygen than nitrogen in its composition. Moreover, a silicon nitride oxide has a higher amount of nitrogen than oxygen in its composition.

In addition, in this specification and the like, the term "insulator" can be rephrased as insulating film or insulating layer. Moreover, the term "conductor" can be rephrased as conductive film or conductive layer. Furthermore, the term "semiconductor" can be rephrased as semiconductor film or semiconductor layer.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. In addition, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film refers to a film having a function of inhibiting the transmission of oxygen and impurities such as water and hydrogen, and the barrier film that has conductivity is sometimes referred to as a conductive barrier film.

In this specification and the like, a metal oxide means an oxide of a metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, when OS transistor is mentioned, the OS transistor can also be called a transistor including an oxide or an oxide semiconductor.

In this specification and the like, normally off means drain current per micrometer of channel width flowing through a transistor being $1\times10^{-20}$ A or less at room temperature, $1\times10^{-18}$ A or less at 85° C., or $1\times10^{-16}$ A or less at 125° C. when a potential is not applied to a gate or a ground potential is applied to the gate.

Embodiment 1

In this embodiment, a film represented by a metal oxide of one embodiment of the present invention is described.

Note that in this specification, when a film of one embodiment of the present invention has a function of a semiconductor, the film can be used in a region where a channel of a transistor is formed (hereinafter also referred to as a channel formation region). A film according to one embodiment of the present invention is described below using FIG. 1.

In the transistor, a metal oxide functioning as an oxide semiconductor (hereinafter also referred to as an oxide semiconductor) is preferably used in the channel formation region. The transistor in which a metal oxide is used in its channel formation region has an extremely low leakage current in a non-conduction state; thus, a semiconductor device with low power consumption can be provided. Moreover, the metal oxide can be deposited by a sputtering method or the like, and thus can be used for a transistor included in a highly integrated semiconductor device.

When a metal oxide is used in a channel formation region of a transistor, a metal oxide with high crystallinity is preferably used. When a metal oxide with high crystallinity is used for the channel formation region of the transistor, the stability or the reliability of the transistor can be improved. As a metal oxide having high crystallinity, a CAAC-OS (c-axis aligned crystalline oxide semiconductor) film is used, for example.

The CAAC-OS has c-axis alignment, a plurality of nanocrystals are connected in the a-b plane direction, and its crystal structure has distortion. Here, nanocrystals refer to small crystals having a periodic atomic arrangement in a region of greater than or equal to 1 nm and less than or equal to 10 nm, in particular, in a region of greater than or equal to 1 nm and less than or equal to 3 nm, for example. Nanocrystals in the CAAC-OS are crystals having a layered structure. In a TEM image of a surface parallel to the c-axes of the nanocrystals, an image in which a bright stripe and a dark stripe appear alternately in the c-axis direction (also referred to as a lattice stripe) is observed. Note that distortion refers to a portion in a region where a plurality of nanocrystals are connected in which the direction of a lattice arrangement changes between a region with a regular lattice arrangement and another region with a regular lattice arrangement. It is difficult to observe a clear crystal grain boundary even in the vicinity of the distortion in the CAAC-OS.

When the distortion is made smaller, even in a region where a plurality of nanocrystals are connected, the atomic arrangement may have periodicity. In this specification, a region in which the whole structure of a plurality of connected nanocrystals having a periodic atomic arrangement is called region A. Note that the minimum size of the region A is the size of a nanocrystal. The size of the region A is 30 nm in some cases, for example. Increasing the size of the region A can reduce the distortion of the metal oxide, and the metal oxide with reduced distortion has stable physical properties. Consequently, the metal oxide is resistant to heat and has high reliability. Thus, a transistor using a metal oxide can have improved stability or reliability.

Note that in the CAAC-OS, it is difficult to observe a clear grain boundary in a region where a plurality of regions A are connected or in a region where nanocrystals and the region A are connected.

In order to increase the size of the region A, the crystallinity of a metal oxide needs to be increased. Examples of a method for improving the crystallinity of a metal oxide include increasing the substrate temperature and increasing the flow rate of oxygen gas when depositing the metal oxide. However, when the substrate temperature is increased or the flow rate of oxygen gas is increased, the metal oxide will have a polycrystalline structure and is highly likely to form a crystal grain boundary. In addition, the crystallinity of the metal oxide is easily influenced by the planarity of the film located below the metal oxide.

Thus, the planarity of the film located below the metal oxide is preferably increased. By increasing the planarity of the film, the normal direction of a top surface of the film becomes almost uniform over a wide area. Thus, when the c-axes of the nanocrystals in the metal oxide are aligned in the normal direction, the nanocrystals are more likely to be connected to one other and have a large region A, and a metal oxide with reduced distortion can be formed. Note that a normal direction is the average direction of the normal vectors with respect to the top surface of the film in the region where the nanocrystals and the film overlap with each other. Furthermore, "the c-axes of the nanocrystals are aligned in the normal direction" refers to the case where the angle between the c-axes and the normal direction of the nanocrystals is greater than or equal to $-15°$ and less than or equal to $15°$.

Note that in some cases, in a transistor using a metal oxide in its channel formation region, the surface over which the metal oxide is formed is a top surface of an insulating film that functions as a gate insulator or an interlayer film; and the surface over which the insulating film is formed is a top surface of a conductive film that functions as a gate electrode or a wiring. Examples of the conductive film include a tungsten film, a titanium nitride film, and a tantalum nitride film. The conductive film is formed by a sputtering method or the like. The sputtering method is a deposition method in which grains ejected from the target is deposited. Therefore, the conductive film has low planarity in some cases.

Examples of the insulating film include a silicon oxynitride film, an aluminum oxide film, and a hafnium oxide film. The insulating film is formed by a CVD method, an ALD method, or the like. A CVD method and an ALD method are deposition methods where a film is formed by a reaction at a surface of an object. Thus, the planarity of the insulating film is easily affected by the planarity of the conductive film which is the surface where the insulating film is to be formed.

As described above, in a metal oxide, when the film located below the metal oxide is a stacked-layer structure of a conductive film and an insulating film over the conductive film, the planarity of the film that is located further below is preferably increased. That is, in order to increase the planarity of the surface over which the metal oxide is formed, the planarity of the conductive film located below the metal oxide is preferably increased. The crystallinity of the metal oxide can be increased by increasing the planarity of the conductive film.

The relationship between the size of the region A included in a metal oxide and the planarity of a film located below the metal oxide is described below. Here, the case where the film located below the metal oxide is two layers is described.

FIGS. 1(A) to 1(D) are schematic views of a metal oxide and a film located below the metal oxide. In FIGS. 1(A) to 1(D), a film 51 is formed over a film 50, and an oxide film 52 is formed over the film 51. The oxide film 52 includes a plurality of regions 53. In FIGS. 1(A) to 1(D), for example, the film 50 is a film functioning as a conductor, the film 51 is a film functioning as an insulator, the oxide film 52 is a metal oxide, and the region 53 is a region A. Note that the film 50 and the film 51 may each have a stacked-layer structure.

Here, the region 53 included in the oxide film 52 is described. FIG. 1(E) is a schematic view of the region 53 included in the oxide film 52. The region 53 has a periodic atomic arrangement. In particular, in the case where the oxide film 52 is an In-M-Zn oxide, the region 53 has a layered crystal structure (also referred to as a layered structure) in which a layer including indium and oxygen (hereinafter, In layer) and a layer including the element M, zinc, and oxygen (hereinafter, (M, Zn) layer) are stacked. The normal direction of each layer is the c-axis, and the surface which each layer forms is the a-b plane.

The size of the region 53 in the a-b plane direction is 30 nm in some cases, depending on the deposition conditions of the oxide film 52 or the planarity of the film located below the oxide film 52. Note that in FIG. 1, the size of the c-axis direction of the region 53 is shown to be the same as the film thickness of the oxide film 52, but the size is not limited thereto. The region 53 is at least formed in a channel formation region of a transistor. Therefore, the size of the region 53 in the c-axis direction may be larger than the minimum size of the nanocrystals in the c-axis direction (for example, 0.7 nm) and smaller than the film thickness of the oxide film 52.

First, a method for evaluating the planarity of a film is described. Examples of a method for evaluating the planarity of a film include a method for obtaining a roughness curve of a film and calculating a roughness curve parameter. Here, the roughness curve refers to a contour curve obtained by blocking a long-wave component from a cross-sectional curve. The roughness curve parameter is obtained from the roughness curve. Note that the roughness curve parameter includes an arithmetical mean height of roughness curves (Ra), a mean length of roughness curve components (RSm), the maximum height of a roughness curve (Rz), or the like. Note that the roughness curve parameter can be evaluated using an atomic force microscope (AFM), for example.

The arithmetical mean height of roughness curves (Ra) is the mean of the absolute values of a vertical coordinate value Z(X) in a reference length. It can be said that the smaller the arithmetical mean height of roughness curves (Ra), the higher the planarity of a film. The vertical coordinate value Z(X) is the height of the roughness curve at an arbitrary position X.

The mean length of roughness curve components (RSm) is the mean length of contour curve components in a reference length (Xs). It can be said that the greater the mean length of roughness curve components (RSm), the higher the planarity of a film.

The maximum height of the roughness curve (Rz) is the sum of the maximum peak height Zp and the maximum valley depth Zv of the contour curve in a reference length. It can be said that the smaller the maximum height of the roughness curve (Rz), the higher the planarity of a film. Note that the maximum height of the roughness curve (Rz) is referred to as P-V value (Peak-to-Valley Roughness) in some cases.

The roughness curve parameter is based on JIS B 0601-2001 (ISO 4287-1997), but is not limited thereto. For example, the roughness curve parameter may be evaluated by performing image analysis of a TEM image. In an evaluation method by image analysis of a TEM image, for example, the contrast observed in a TEM image represents the interface between layers, and the shape of the interface is assumed to be the roughness curve of the layer located below the interface. A parameter corresponding to the roughness curve parameter is then calculated from the assumed roughness curve. Note that the reference length may be the length of the top surface of the film 50 observed in the TEM image, or may also be the length of the region where the film 50 and the oxide film 52 overlap. In the case of using the evaluation method, the maximum height of the roughness curve (Rz) may be the sum of the maximum peak height and the maximum valley depth of the roughness curve assumed in the evaluation method. Furthermore, the mean length of roughness curve components (RSm) may be the mean length from the peak of the roughness curve assumed in the evaluation method to the neighboring peak, or the mean length from a valley to the neighboring valley.

Note that in the case where the film located below the oxide film 52 functions as a wiring of a transistor, the length of the shape of the film in the short direction is shorter than the reference length in some cases. In this case, by setting the direction of the reference length as the long direction of the shape of the film, the roughness curve parameter can be calculated.

As described above, the size of the region 53 included in the oxide film 52 is preferably large.

FIG. 1(A) is a schematic view of the case where the film 50 is flat. When the film 50 is flat, the planarity of the film 51 increases, and the planarity of the oxide film 52 easily increases. At this time, a large region 53 can be formed in the oxide film 52. Furthermore, different regions 53 are connected to each other in the a-b plane direction.

To increase the size of the region 53, the mean length of roughness curve components (RSm) of the film 50 located below the oxide film 52 is preferably large. The mean length of roughness curve components (RSm) of the film 50 is preferably greater than or equal to 60 nm, further preferably greater than or equal to 80 nm, for example.

Figure 1B:
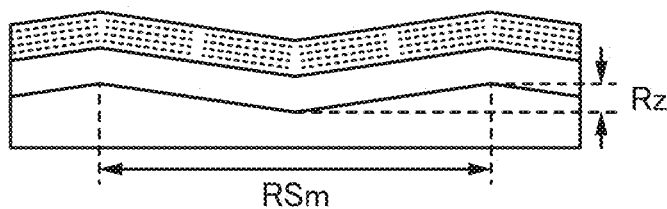

FIG. 1(B) is a schematic view of the case where the mean length of roughness curve components (RSm) of the film 50 is large. For example, in the case where the mean length of roughness curve components (RSm) of the film 50 is greater than or equal to 60 nm, the proportion of a region in which the length from the protrusion to the depression (approximately half the length of RSm) of the top surface of the film 50 and the film 51 is greater than or equal to 30 nm increases. The normal direction with respect to the top film surface of the region is substantially uniform. Thus, in the case where the top film surface of the region is a surface over which the oxide film 52 is formed, the nanocrystals are more likely to be connected to each other by small distortions, and a large region 53 can be formed in the oxide film 52.

In order to increase the size of the region 53, the maximum height (Rz) or the arithmetical mean height (Ra) of roughness curves of the film 50 located below the oxide film 52 is preferably small. The maximum height (Rz) of roughness curves of the film 50 is preferably 10 nm or smaller, further preferably 6.0 nm or smaller, still further preferably 4.0 nm or smaller, for example. The arithmetical mean height of roughness curves (Ra) of the film 50 is preferably 1.0 nm or smaller, further preferably 0.5 nm or smaller, still further preferably 0.3 nm or smaller, for example.

Figure 1C:
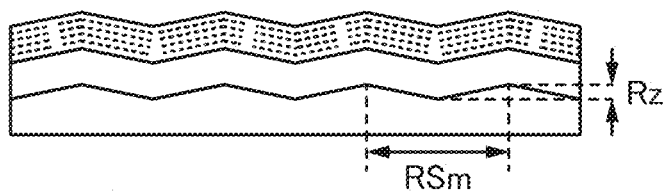

FIG. 1(C) is a schematic view of the case where the maximum height of the roughness curve (Rz) of the film 50 is small. By making the height (Rz) or the arithmetical mean height (Ra) of roughness curves of the film 50 small, in the protrusion or the depression of the top surface of the film 51, different nanocrystals connect to each other by small distortions, and a large region 53 can be formed in the oxide film 52.

Note that when the mean length of roughness curve components (RSm) of the film 50 is sufficiently large, even when the maximum height (Rz) or the arithmetical mean height (Ra) of roughness curves of the film 50 is large, a large region 53 can be formed. For example, in the case where the mean length of roughness curve components (RSm) of the film 50 is 60 nm or greater, the maximum height of the roughness curve (Rz) of the film 50 may be greater than 6.0 nm, or the arithmetical mean height of roughness curves (Ra) of the film 50 may be greater than 0.5 nm.

When the height (Rz) or the arithmetical mean height (Ra) of roughness curves of the film 50 is sufficiently small, even when the mean length of roughness curve components (RSm) of the film 50 is small, a large region 53 can be formed. For example, in the case where the maximum height of the roughness curve (Rz) of the film 50 is 6.0 nm or smaller, or the arithmetical mean height of roughness curves (Ra) of the film 50 is 0.5 nm or smaller, the mean length of roughness curve components (RSm) of the film 50 may be less than 60 nm.

Figure 1D:
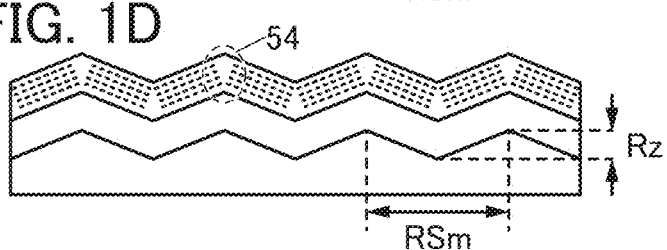
Figure 1E:
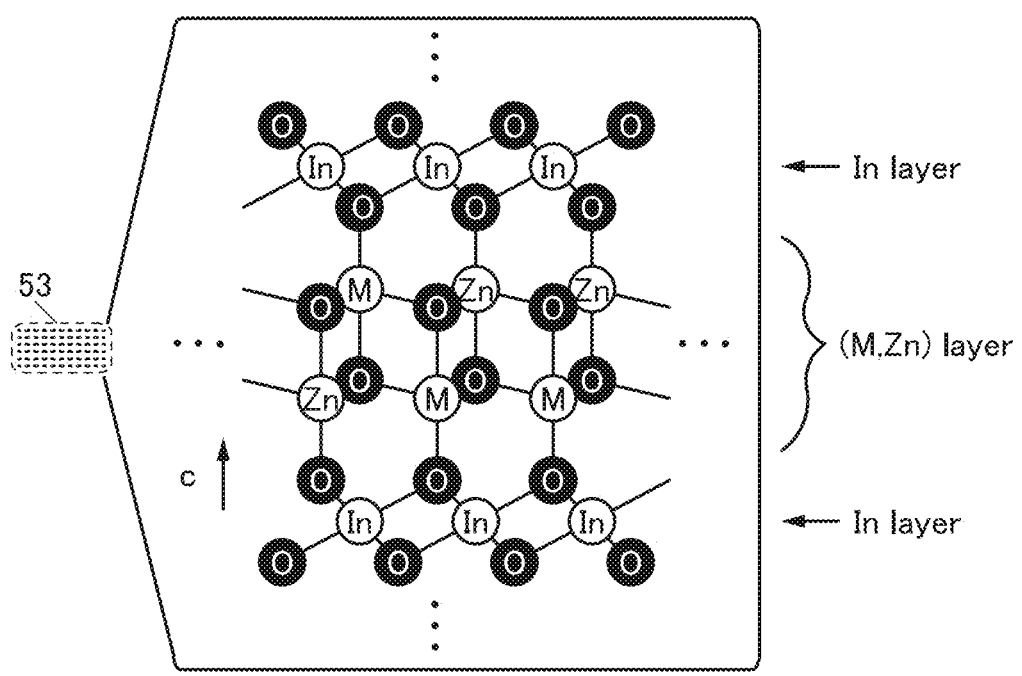

FIG. 1(D) is a schematic view of the case where the mean length of roughness curve components (RSm) of the film 50 is small, and the maximum height (Rz) or the arithmetical mean height (Ra) of roughness curves of the film 50 is large. At this time, the region where the normal direction with respect to the top film surface of the film 51 is substantially uniform becomes narrow, and the size of the region 53 is speculated to become smaller. Furthermore, in a region 54 on the protrusion or the depression of the top surface of the film 51, the distortion increases, leading to difficulty in different nanocrystals connecting with each other, and the crystallinity may possibly decrease.

As described above, when the planarity of the film located below the metal oxide is increased, the nanocrystals are more likely to connect with each other, and a large region A can be formed in the metal oxide. By using the metal oxide in the channel formation region of a transistor, the stability or the reliability of the transistor can be improved.

Note that as a method for increasing the planarity of a film located below the metal oxide, a CMP (Chemical Mechanical Polishing) treatment, a smoothing treatment using the CMP treatment, or the like may be performed.

This embodiment can be implemented in an appropriate combination with any of the structures described in the other embodiments, examples, and the like.

Embodiment 2

An example of a semiconductor device including a transistor 200 of one embodiment of the present invention will be described below.

<Structure Example of Semiconductor Device>

Figure 2A:
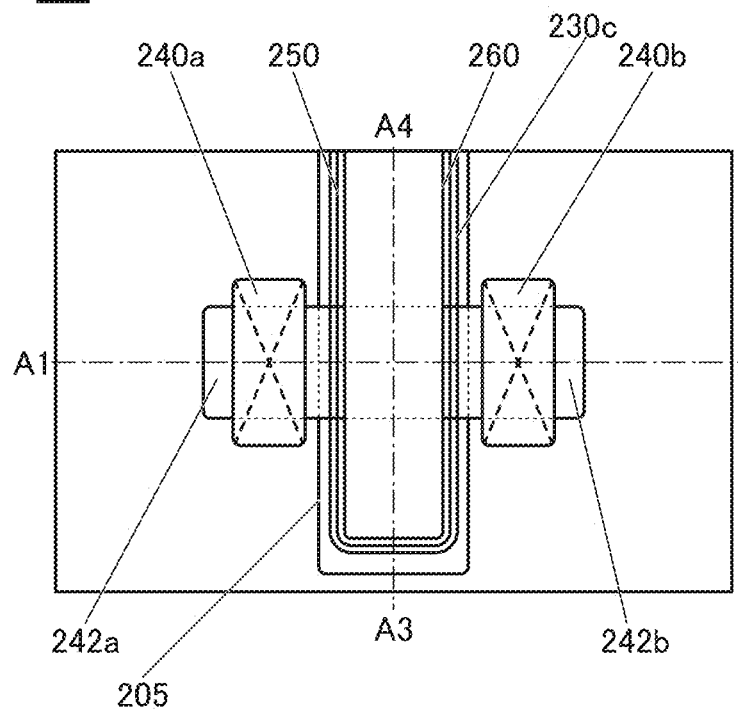
FIGS. 2A-2C A top view and cross-sectional views of a semiconductor device of one embodiment of the present invention.
Figure 2C:
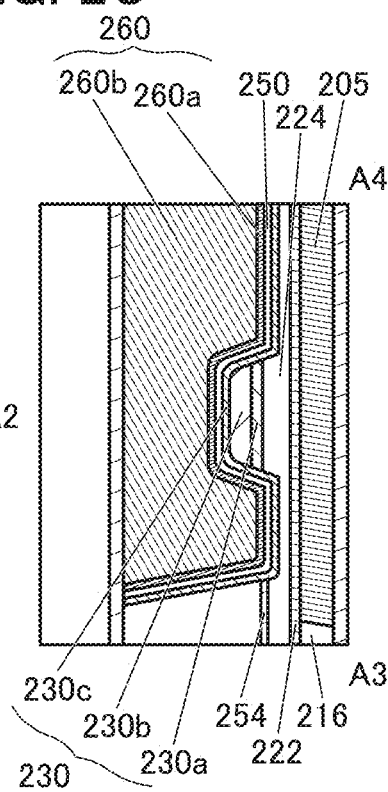
Figure 2B:
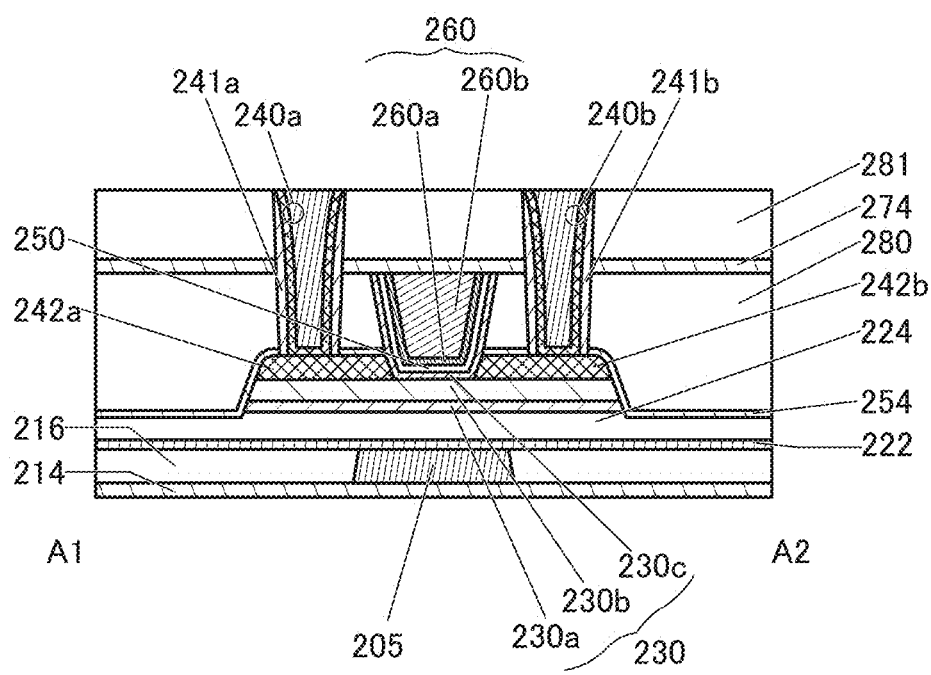

FIG. 2(A), FIG. 2(B), and FIG. 2(C) are a top view and cross-sectional views of the transistor 200 of one embodiment of the present invention and its surroundings.

FIG. 2(A) is the top view of the semiconductor device including the transistor 200. FIG. 2(B) and FIG. 2(C) are cross-sectional views of the semiconductor device. Here, FIG. 2(B) is a cross-sectional view of a portion indicated by a dashed-dotted line A1-A2 in FIG. 2(A), and is a cross-sectional view in the channel length direction of the transistor 200. FIG. 2(C) is a cross-sectional view of a portion indicated by a dashed-dotted line A3-A4 in FIG. 2(A), and is a cross-sectional view of the transistor 200 in the channel width direction. Note that for clarification of the drawing, some components are omitted in the top view of FIG. 2(A).

The semiconductor device of one embodiment of the present invention includes the transistor 200 and an insulator 281 functioning as an interlayer film. A conductor 240 (a conductor 240a and a conductor 240b) functioning as a plug and being electrically connected to the transistor 200 is also included. Note that an insulator 241 (an insulator 241a and an insulator 241b) is provided in contact with the side surface of the conductor 240 functioning as a plug.

The insulator 241 is provided in contact with the inner wall of an opening formed in an insulator 254, an insulator 274, an insulator 280, and the insulator 281. A first conductor of the conductor 240 is provided in contact with the side surface of the insulator 241, and a second conductor of the conductor 240 is provided further inwards. Here, the height of the top surface of the conductor 240 and the top surface of the insulator 281 can be approximately the same. Although the transistor 200 having a structure in which the first conductor of the conductor 240 and the second conductor of the conductor 240 are stacked is illustrated, the present invention is not limited thereto. For example, a structure in which the conductor 240 is provided as a single layer or as a stacked-layer structure of three or more layers may be used. When a structure body has a stacked-layer structure, the layers are distinguished with ordinal numbers corresponding to the formation order in some cases.

[Transistor 200]

As illustrated in FIG. 2, the transistor 200 includes an insulator 214 and an insulator 216 positioned over a substrate (not illustrated); a conductor 205 positioned to be embedded in the insulator 214 and the insulator 216; an insulator 222 positioned over the insulator 216 and the conductor 205; an insulator 224 positioned over the insulator 222; an oxide 230 (an oxide 230a, an oxide 230b, and an oxide 230c) positioned over the insulator 224; an insulator 250 positioned over the oxide 230c; a conductor 260 (a conductor 260a and a conductor 260b) positioned over the insulator 250; a conductor 242a and a conductor 242b in contact with a portion of the top surface of the oxide 230b; an insulator 254 positioned to be in contact with the top surface of the insulator 224, the side surface of the oxide 230a, the side surface of the oxide 230b, the side surface of the conductor 242a, the top surface of the conductor 242a, the side surface of the conductor 242b, and the top surface of the conductor 242b; an insulator 280 positioned over the insulator 254; and an insulator 274 positioned over the insulator 280. The conductor 260 includes the conductor 260a and the conductor 260b, and the conductor 260a is positioned to cover the bottom surface and the side surface of the conductor 260b. As shown in FIG. 2(B), the top surface of the conductor 260 is substantially aligned with the top surface of the insulator 250 and the top surface of the oxide 230c. The insulator 274 is in contact with each of the top surfaces of the conductor 260, the oxide 230c, and the insulator 250, and the side surface of the insulator 241.

The insulator 222, the insulator 254, and the insulator 274 preferably have a function of inhibiting the diffusion of hydrogen (for example, at least one of a hydrogen atom, a hydrogen molecule, or the like). In addition, the insulator 222, the insulator 254, and the insulator 274 preferably have a function of inhibiting diffusion of oxygen (for example, at least one of an oxygen atom, an oxygen molecule, or the like). For example, the insulator 222, the insulator 254, and the insulator 274 preferably have lower permeability of one or both of oxygen and hydrogen than the insulator 224. The insulator 222, the insulator 254, and the insulator 274 preferably have lower permeability of one or both of oxygen and hydrogen than the insulator 250. The insulator 222, the insulator 254, and the insulator 274 preferably have lower permeability of one or both of both oxygen and hydrogen than the insulator 280.

As illustrated in FIGS. 2(B) and 2(C), the insulator 254 is preferably in contact with the top surface and the side surface of the conductor 242a, the top surface and the side surface of the conductor 242b, the side surface of the oxide 230a and the oxide 230b, and the top surface of the insulator 224. The insulator 224 and the oxide 230 are covered with the insulator 254 having a barrier property against hydrogen, whereby the insulator 280 is isolated from the insulator 224, the oxide 230 by the insulator 254. Accordingly, the entry of impurities such as hydrogen from the outside of the transistor 200 can be inhibited, and the transistor 200 can be provided with favorable electrical characteristics and reliability.

The oxide 230 preferably includes the oxide 230a positioned over the insulator 224, the oxide 230b positioned over the oxide 230a, and the oxide 230c that is positioned over the oxide 230b and that is at least partly is in contact with the top surface of the oxide 230b.

Note that the transistor 200 has a structure in which three layers of the oxide 230a, the oxide 230b, and the oxide 230c are stacked in the channel formation region and its vicinity; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers can be employed.

Here, the conductor 260 functions as a gate electrode of the transistor, and the conductor 242a and the conductor 242b function as a source electrode or a drain electrode. In the transistor 200, the conductor 260 functioning as a gate electrode is formed in a self-aligned manner to fill an opening formed in the insulator 280 and the like. The formation of the conductor 260 in this manner allows the conductor 260 to be positioned certainly in the region between the conductor 242a and the conductor 242b without alignment.

Note that as illustrated in FIG. 2, the conductor 260 preferably includes the conductor 260a, and the conductor 260b positioned over the conductor 260a. Although in the transistor 200, the conductor 260 has a two-layer stacked structure, the present invention is not limited thereto. For example, the conductor 260 may be a single-layer structure or a stacked-layer structure of three or more layers.

The transistor 200 preferably includes the insulator 214 positioned over a substrate (not illustrated); the insulator 216 positioned over the insulator 214; the conductor 205 positioned to be embedded in the insulator 214 and the insulator 216; and the insulator 222 positioned over the insulator 216 and the conductor 205. Furthermore, the insulator 224 is preferably positioned over the insulator 222.

In the transistor 200, for the oxide 230 (the oxide 230a, the oxide 230b, and the oxide 230c), which includes a channel formation region, a metal oxide functioning as an oxide semiconductor (hereinafter also referred to as an oxide semiconductor) is preferably used.

The transistor 200 using an oxide semiconductor in its channel formation region has an extremely low leakage current (off-state current) in a non-conduction state; thus, a semiconductor device with low power consumption can be provided. An oxide semiconductor can be deposited by a sputtering method or the like, and can be used for the transistor 200 constituting a highly integrated semiconductor device.

For the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) may be used. In particular, aluminum, gallium, yttrium, or tin may be used as the element M. In addition, for the oxide 230, an In—Ga oxide or an In—Zn oxide may be used.

The electrical characteristics of a transistor using an oxide semiconductor tend to have variations when impurities and oxygen vacancies exist in the channel formation region of the oxide semiconductor, and the reliability decreases in some cases. Moreover, if the channel formation region of the oxide semiconductor includes oxygen vacancies, the transistor tends to have normally on characteristics. Thus, oxygen vacancies in a region where a channel is formed are preferably reduced as much as possible. For example, oxygen may be supplied to the oxide 230 through the insulator 250 or the like to supplement the oxygen vacancies. Accordingly, a transistor with suppressed variation in electrical characteristics, stable electrical characteristics, and improved reliability can be provided.

In the case where an element included in the conductor 242 (the conductor 242a and the conductor 242b) functioning as a source electrode and a drain electrode and provided over and in contact with the oxide 230 has a function of absorbing oxygen in the oxide 230, a low-resistance region is sometimes partly formed between the oxide 230 and the conductor 242, or in the vicinity of the surface of the oxide 230. In that case, in the low-resistance region, an impurity (hydrogen, nitrogen, a metal element, or the like) that enters oxygen vacancies serves as a donor, and the carrier density increases in some cases. Note that in the following, hydrogen that enters oxygen vacancies is sometimes referred to as $V_oH$.

Figure 3A:
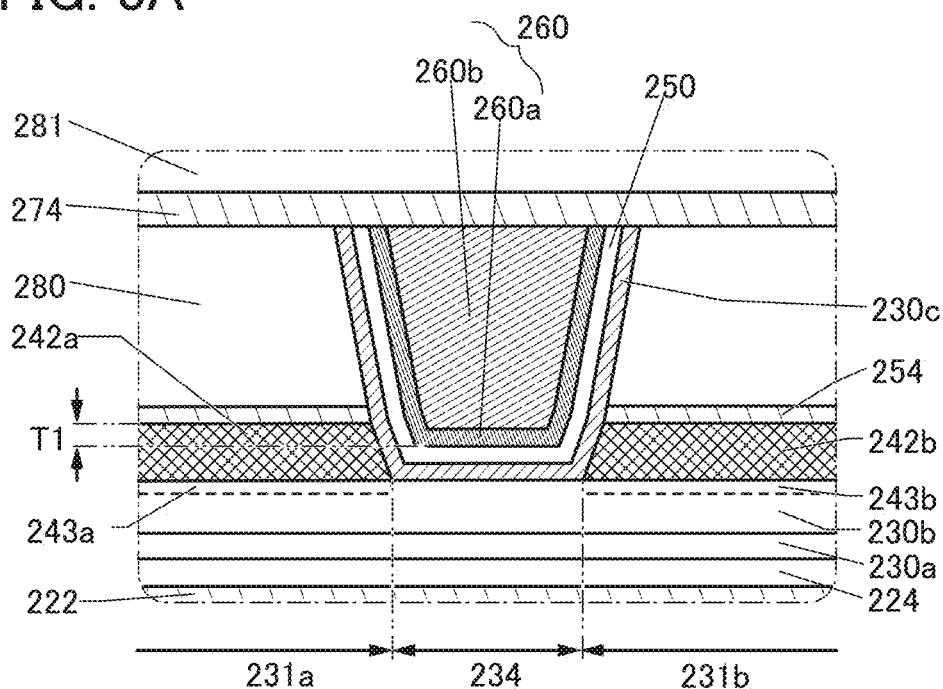
FIGS. 3A-3B Cross-sectional views of a semiconductor device of one embodiment of the present invention.

FIG. 3(A) illustrates an enlarged view of a region in part of the transistor 200 illustrated in FIG. 2(B). As illustrated in FIG. 3(A), the conductor 242 is provided over and in contact with the oxide 230b, and a region 243 (a region 243a and a region 243b) is sometimes formed as a low-resistance region at an interface between the oxide 230 and the conductor 242 and the vicinity of the interface. The oxide 230 includes a region 234 functioning as a channel formation region of the transistor 200 and a region 231 (a region 231a and a region 231b) including part of the region 243 and functioning as a source region or a drain region. Note that in the following drawings, even when the region 243 is not illustrated in an enlarged view or the like, the same region 243 has been formed in some cases.

Note that although an example in which the region 243a and the region 243b are provided to spread in the depth direction of the oxide 230b near the conductor 242 is illustrated, the present invention is not limited thereto. The region 243a and the region 243b may be formed as appropriate in accordance with the required electrical characteristics of the transistor. In the oxide 230, the boundaries between the regions are difficult to detect clearly in some cases. The concentration of an element detected in each region may not only gradually change between the regions, but also continuously change (also referred to as a gradation) within each region.

Figure 3B:
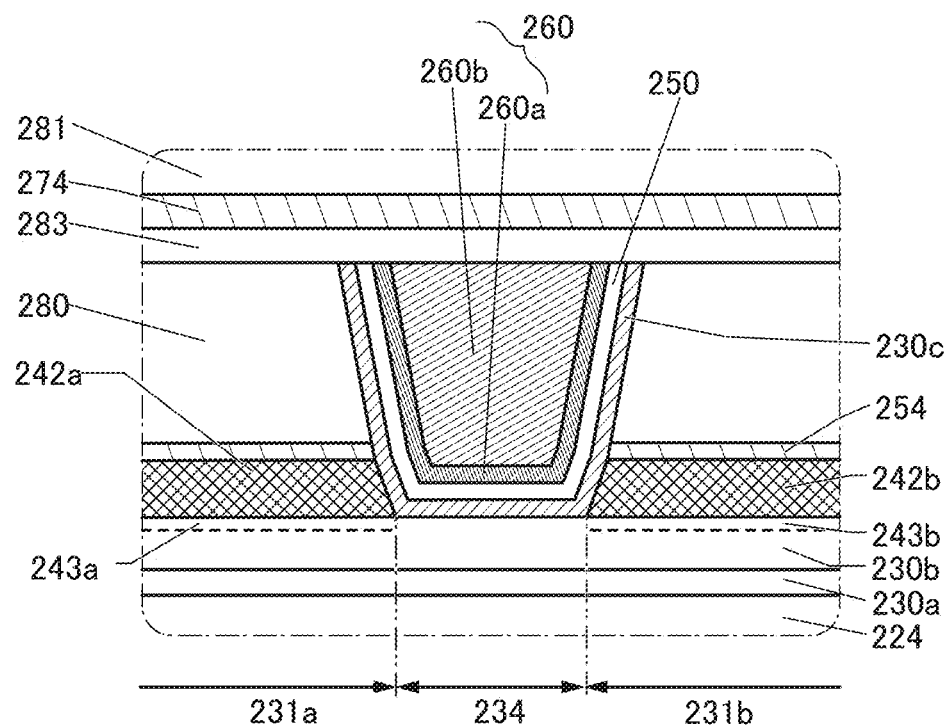

FIG. 3(B) illustrates an example of a transistor in which an insulator 283 is positioned between the insulator 280 and the insulator 274. That is, the transistor has a structure in which the insulator 274 is not in contact with the insulator 250. In such a structure, impurities such as hydrogen contained in the insulator 280 and the like may enter the insulator 250 through the insulator 283. Impurities such as hydrogen entering the insulator 250 are diffused to the oxide 230 in the channel formation region, which may adversely affect the electrical characteristics and the reliability of the transistor.

As shown in FIG. 3(A), the transistor 200 of one embodiment of the present invention has a structure in which the insulator 274 and the insulator 250 are directly in contact with each other. In such a structure, the entry of impurities such as hydrogen contained in the insulator 280 and the like into the insulator 250 can be suppressed, which can inhibit the adverse effects on the electrical characteristics and the reliability described above.

In FIG. 3(A), with the bottom surface of the insulator 224 as a reference, the height of the bottom surface of the conductor 260 in a region overlapping with the region 234 is preferably lower than the height of the top surface of each of the conductor 242a and the conductor 242b. With this structure, an electric field from the conductor 260 functioning as a gate electrode can operate on the whole channel formation region, which is preferable because the transistor will operate favorably. When the difference between the height of the bottom surface of the conductor 260 in the region overlapping with the region 234 and the height of the top surface of each of the conductor 242a and the conductor 242b is represented by T1, T1 is greater than or equal to 0 nm and smaller than or equal to 30 nm, preferably greater than or equal to 0 nm and smaller than or equal to 15 nm.

Figure 4:
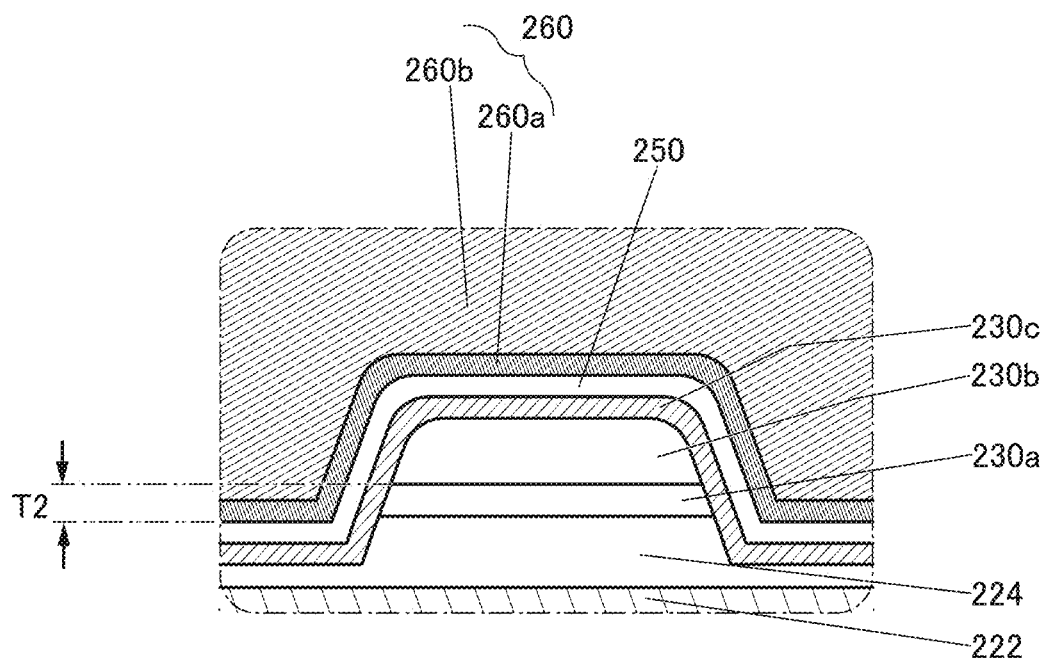
FIG. 4 A cross-sectional view of a semiconductor device of one embodiment of the present invention.

FIG. 4 illustrates an enlarged view of a region in part of the transistor 200 illustrated in FIG. 2(C). FIG. 4 is an enlarged view of the channel formation region in the channel width direction of the transistor 200.

As shown in FIG. 4, with the bottom surface of the insulator 224 as a reference, the height of the bottom surface of the conductor 260 in a region where the conductor 260 does not overlap with the oxide 230a and the oxide 230b is preferably lower than the height of the bottom surface of the oxide 230b. When the difference between the height of the bottom surface of the conductor 260 in the region where the conductor 260 does not overlap with the oxide 230b and the height of the bottom surface of the oxide 230b is T2, T2 is greater than or equal to 0 nm and smaller than or equal to 100 nm, preferably greater than or equal to 3 nm and smaller than or equal to 50 nm, further preferably greater than or equal to 5 nm and smaller than or equal to 20 nm.

Accordingly, a structure in which the conductor 260, which functions as a gate electrode, covers the side surface and the top surface of the oxide 230b in the channel formation region with the oxide 230c and the insulator 250 therebetween is obtained, and this enables the electrical field of the conductor 260 to operate on the whole oxide 230b in the channel formation region easily. Hence, the transistor 200 can have increased on-state current and improved frequency characteristics.

Thus, a semiconductor device including a transistor having a high on-state current can be provided. A semiconductor device including a transistor having high frequency characteristics can be provided. A semiconductor device having suppressed variation in electrical characteristics, stable electrical characteristics, and improved reliability can be provided. In addition, a semiconductor device including a transistor having a low off-state current can be provided.

The structure of the semiconductor device including the transistor 200 of one embodiment of the present invention will be described in detail below.

The conductor 205 is positioned to overlap with the oxide 230 and the conductor 260. Furthermore, the conductor 205 is preferably provided to be embedded in the insulator 214 and the insulator 216.

Here, the conductor 260 functions as a first gate (also referred to as a top gate) electrode in some cases. The conductor 205 functions as a second gate (also referred to as a back gate) electrode in some cases. In that case, by changing the potential applied to the conductor 205 not in conjunction with but independently from the potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current when a potential applied to the conductor 260 is 0 V can be smaller in the case where a negative potential is applied to the conductor 205 than in the case where the negative potential is not applied to the conductor 205.

Note that as shown in FIG. 2(A), the conductor 205 may be provided to be larger than the region 234 in the oxide 230. In particular, as illustrated in FIG. 2(C), the conductor 205 preferably extends to a region outside an end portion of the region 234 in the oxide 230 that intersects with the channel width direction. That is, the conductor 205 and the conductor 260 preferably overlap with each other with the insulators therebetween outside the side surface of the oxide 230 in the channel width direction.

With the above structure, the channel formation region in the region 234 can be electrically surrounded by the electric field of the conductor 260 having a function of a first gate electrode and the electric field of the conductor 205 having a function of a second gate electrode. In this specification, a transistor structure in which a channel formation region is electrically surrounded by electric fields of a first gate electrode and a second gate electrode is referred to as a surrounded channel (S-channel) structure.

Moreover, a conductive material containing tungsten, copper, or aluminum as its main component is preferably used for the conductor 205. Note that the conductor 205 is illustrated as a single layer but may be a stacked-layer structure such as a stacked layer of the above conductive material and titanium or titanium nitride.

The insulator 214 preferably functions as a barrier insulating film that inhibits impurities such as water and hydrogen from entering the transistor 200 from the substrate side. Accordingly, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (for example, $N_2O$, NO, and $NO_2$), and a copper atom (an insulating material that does not easily allow the diffusion of the above impurities) is preferably used. Alternatively, an insulating material which has a function of inhibiting diffusion of oxygen (for example, at least one of oxygen atoms, oxygen molecules, and the like) is preferably used (the above oxygen does not easily permeate).

For example, silicon nitride or the like is preferably used for the insulator 214. Accordingly, impurities such as water and hydrogen can be inhibited from diffusing into the transistor 200 side from the side closer to the substrate than the insulator 214. Alternatively, oxygen contained in the insulator 224 and the like can be inhibited from diffusing into the side closer to the substrate than the insulator 214.

The permittivity of the insulator 216, the insulator 280, and the insulator 281 is preferably lower than that of the insulator 214. When a material with a low permittivity is used for an interlayer film, parasitic capacitance generated between wirings can be reduced. For example, as the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 222 and the insulator 224 have a function of a gate insulator.

Here, oxygen is preferably released from the insulator 224 in contact with the oxide 230 by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material in which oxygen is partly released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$, or greater than or equal to $3.0 \times 10^{20}$ atoms/cm$^3$ in thermal desorption spectroscopy (TDS) analysis. Note that the temperature of the film surface in the TDS analysis is preferably in a range greater than or equal to 100° C. and less than or equal to 700° C., or greater than or equal to 100° C. and less than or equal to 400° C.

As illustrated in FIG. 2(C), the film thickness of the insulator 224 in a region overlapped by neither the insulator 254 nor the metal oxide 230b is sometimes thinner than the film thickness of the other regions. In the insulator 224, the region overlapped by neither the insulator 254 nor the metal oxide 230b preferably has a film thickness which allows adequate diffusion of the above oxygen.

The insulator 222 preferably functions as a barrier insulating film that inhibits impurities such as water and hydrogen from diffusing to the transistor 200 from the substrate side. For example, the insulator 222 preferably has lower hydrogen permeability than the insulator 224. By surrounding the insulator 224 and the oxide 230 with the insulator 222 and the insulator 254, the entry of impurities such as water and hydrogen from the outside into the transistor 200 can be inhibited.

Furthermore, the insulator 222 having a function of inhibiting diffusion of oxygen (for example, at least one of oxygen atoms, oxygen molecules, and the like) is preferably used (the above oxygen does not easily permeate). For example, the insulator 222 preferably has a lower oxygen permeability than the insulator 224. The insulator 222 preferably has a function of inhibiting diffusion of oxygen and impurities, so that diffusion of oxygen contained in the oxide 230 to the insulator 216 side can be reduced. Furthermore, the reaction of the conductor 205 with oxygen included in the insulator 224 and the oxide 230 can be suppressed.

An insulator containing an oxide of one or both of aluminum and hafnium, which is an insulating material, may be used for the insulator 222. As the insulator containing an oxide of one or both of aluminum and hafnium, aluminum oxide, hafnium oxide, an oxide containing aluminum and hafnium (hafnium aluminate), or the like is preferably used. The insulator 222 formed using such a material functions as a layer that inhibits release of oxygen from the oxide 230 and entry of impurities such as hydrogen from the surrounding portion of the transistor 200 into the oxide 230.

Aluminum oxide, bismuth oxide, germanium oxide, niobium oxide, silicon oxide, titanium oxide, tungsten oxide, yttrium oxide, zirconium oxide, or the like may be added to these insulators, for example. Alternatively, these insulators may be subjected to nitriding treatment. Silicon oxide, silicon oxynitride, or silicon nitride may be stacked over these insulators.

A single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With scaling down and high integration of a transistor, a problem such as leakage current may arise because of a thinner gate insulator. When a high-k material is used for an insulator functioning as a gate insulator, a gate potential during operation of the transistor can be reduced while keeping the physical thickness of the gate insulator.

Note that the insulator 222 and the insulator 224 may have a stacked-layer structure of two or more layers. In that case, without being limited to a stacked-layer structure formed of the same material, a stacked-layer structure formed of different materials may be employed.

The oxide 230 includes the oxide 230a, the oxide 230b over the oxide 230a, and the oxide 230c over the oxide 230b. When the oxide 230a is provided below the oxide 230b, diffusion of impurities from the components formed below the oxide 230a into the oxide 230b can be suppressed. When the oxide 230c is provided over the oxide 230b, diffusion of impurities from the components formed above the oxide 230c into the oxide 230b can be suppressed.

Note that the oxide 230 preferably has a stacked-layer structure of oxides which differ in the atomic ratio of metal atoms. Specifically, the atomic ratio of the element M in the metal oxide used for the oxide 230a is preferably greater than the atomic ratio of the element M in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b preferably has crystallinity. For example, a CAAC-OS described later is preferably used. An oxide having crystallinity, such as a CAAC-OS, has a dense structure with a small amount of impurities and defects (oxygen vacancies or the like) and high crystallinity. This can inhibit oxygen extraction from the oxide 230b by the source electrode or the drain electrode. Accordingly, oxygen extraction from the oxide 230b even when heat treatment is performed can be reduced; hence, the transistor 200 is stable with respect to high temperatures in the manufacturing process (what is called thermal budget).

The energy level of the conduction band minimum of the oxide 230a and the oxide 230c is preferably higher than the energy level of the conduction band minimum of the oxide 230b. In other words, the electron affinity of the oxide 230a and the oxide 230c is preferably smaller than the electron affinity of the oxide 230b.

The energy level of the conduction band minimum gradually changes at a junction portion of the oxide 230a, the oxide 230b, and the oxide 230c. In other words, the energy level of the conduction band minimum at a junction portion of the oxide 230a, the oxide 230b, and the oxide 230c continuously changes or is continuously connected. To achieve this, the density of defect states in a mixed layer formed at an interface between the oxide 230a and the oxide 230b and an interface between the oxide 230b and the oxide 230c is made low.

Specifically, as the oxide 230a, a metal oxide having In:Ga:Zn=1:3:4 [atomic ratio] or 1:1:0.5 [atomic ratio] is used. As the oxide 230b, a metal oxide having In:Ga:Zn=4:2:3 [atomic ratio] or 3:1:2 [atomic ratio] is used. As the oxide 230c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, as a specific example of the oxide 230c having a stacked-layer structure, a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], or a stacked-layer structure of In:Ga:Zn=4:2:3 [atomic ratio] and a gallium oxide can be given.

At this time, the oxide 230b becomes a main carrier path. When the oxide 230a and the oxide 230c have the above structure, the density at defect states of the interface between the oxide 230a and the oxide 230b and the interface between the oxide 230b and the oxide 230c can be made low. Thus, the influence of interface scattering on carrier conduction becomes small, and the transistor 200 can obtain a high on-state current and high frequency characteristics. Note that in the case where the oxide 230c has a stacked-layer structure, in addition to the reduction of density of defect states at the interface between the oxide 230b and the oxide 230c, the inhibition of diffusion of the constituent element of the oxide 230c to the insulator 250 side is expected. More specifically, since the oxide 230c has a stacked-layer structure in which an oxide that does not contain In is positioned in the upper layer, the diffusion of In into the insulator 250 side can be inhibited. Since the insulator 250 functions as a gate insulator, the transistor exhibits poor characteristics when In diffuses into the insulator 250. Thus, when the oxide 230c has a stacked-layer structure, a highly reliable semiconductor device can be provided.

A metal oxide functioning as an oxide semiconductor is preferably used for the oxide 230. For example, as the metal oxide to be the region 234, it is preferable to use a metal oxide having a band gap of 2 eV or more, preferably 2.5 eV or more. With the use of a metal oxide having such a wide band gap, the off-state current of the transistor can be reduced. By using such a transistor, a semiconductor device with low power consumption can be provided.

The conductor 242 (the conductor 242a and the conductor 242b) functioning as the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element as a component; an alloy containing a combination of the above metal elements; or the like, is preferably used. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 254, as in the insulator 214 and the like, preferably functions as a barrier insulating film inhibiting impurities such as water and hydrogen from entering the transistor 200 from the insulator 280 side. For example, the insulator 254 preferably has lower hydrogen permeability than the insulator 224. Furthermore, as illustrated in FIGS. 2(B) and 2(C), the insulator 254 is preferably in contact with the top surface and the side surface of the conductor 242a, the top surface and the side surface of the conductor 242b, the side surfaces of the oxide 230a and the oxide 230b, and the top surface of the insulator 224. In using such a structure, entry of hydrogen contained in the insulator 280 into the channel formation region of the oxide 230 can be suppressed.

Moreover, the insulator 254 having a function of inhibiting diffusion of oxygen (for example, at least one of oxygen atoms, oxygen molecules, and the like) is preferably used (the above oxygen does not easily permeate). For example, the insulator 254 preferably has lower oxygen permeability than the insulator 224.

The insulator 254 is preferably deposited by a sputtering method. When the insulator 254 is deposited by a sputtering method in an oxygen-containing atmosphere, oxygen can be added to the vicinity of a region in the insulator 224 in contact with the insulator 254. Accordingly, oxygen can be supplied from the region to the oxide 230 through the insulator 224. Here, with the insulator 254 having a function of inhibiting upward oxygen diffusion, the diffusion of oxygen from the oxide 230 into the insulator 280 can be prevented. Moreover, with the insulator 222 having a function of inhibiting downward oxygen diffusion, the diffusion of oxygen from the oxide 230 into the insulator 216 can be prevented. Accordingly, oxygen is supplied to the region 234 functioning as the channel formation region in the oxide 230. Thus, oxygen vacancies in the oxide 230 are reduced, and the transistor can be inhibited from becoming normally on.

The insulator 254 can have a multilayer structure of two or more layers. For example, the insulator 254 may have a two-layer structure in which the first layer is deposited by a sputtering method in an oxygen-containing atmosphere, after which the second layer is deposited by an ALD method. An ALD method is a deposition method achieving excellent step coverage, and thus can prevent formation of disconnection or the like due to unevenness of the first layer.

An insulator containing an oxide of one or both of aluminum and hafnium is preferably deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used.

The insulator 250 functions as a gate insulator. The insulator 250 is preferably positioned in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

As in the insulator 224, the insulator 250 is preferably formed using an insulator from which oxygen is released by heating. When an insulator from which oxygen is released by heating is provided as the insulator 250 in contact with the top surface of the oxide 230c, oxygen can be successfully supplied to the region 234 of the oxide 230b. Furthermore, as in the insulator 224, the concentration of impurities such as water and hydrogen in the insulator 250 is preferably reduced. The film thickness of the insulator 250 is preferably greater than or equal to 1 nm and less than or equal to 20 nm.

Furthermore, a metal oxide may be provided between the insulator 250 and the conductor 260. The metal oxide preferably prevents oxygen diffusion from the insulator 250 into the conductor 260. Provision of the metal oxide that inhibits diffusion of oxygen suppresses diffusion of oxygen from the insulator 250 into the conductor 260. That is, a reduction in the amount of oxygen supplied to the oxide 230 can be inhibited. Furthermore, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while maintaining the physical film thickness of the gate insulator. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium such as aluminum oxide, hafnium oxide, or an oxide containing aluminum and hafnium (hafnium aluminate) is preferably used.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule (for example, $N_2O$, NO, and $NO_2$), and a copper atom, is preferably used. Alternatively, a conductive material having a function of inhibiting diffusion of oxygen (for example, at least one of oxygen atoms, oxygen molecules, and the like) is preferably used.

When the conductor 260a has a function of inhibiting diffusion of oxygen, the decrease in conductivity of the conductor 260b because of oxidation due to oxygen contained in the insulator 250 can be inhibited. As a conductive material having a function of inhibiting diffusion of oxygen, for example, tantalum, tantalum nitride, ruthenium, ruthenium oxide, or the like is preferably used.

The conductor 260 also functions as a wiring and thus is preferably formed using a conductor having high conductivity. For example, for the conductor 260b, a conductive material containing tungsten, copper, or aluminum as its main component can be used. The conductor 260b may have a stacked-layer structure of the conductive material and titanium or titanium nitride.

The insulator 280 is provided over the insulator 224, the oxide 230, and the conductor 242 with the insulator 254 therebetween. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in which a region containing oxygen that is released by heating can be easily formed, are particularly preferable.

The concentration of impurities such as water and hydrogen in the insulator 280 is preferably reduced. Furthermore, the top surface of the insulator 280 may be planarized.

As in the insulator 214 or the like, the insulator 274 preferably functions as a barrier insulating film that inhibits impurities such as water and hydrogen from entering into the insulator 280 from above. As the insulator 274, for example, an insulator that can be used as the insulator 214, the insulator 254, or the like may be used.

An insulator 281 functioning as an interlayer film is preferably provided over the insulator 274. As in the insulator 224 or the like, the concentration of impurities such as water and hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are provided to face each other with the conductor 260 interposed therebetween. Note that the level of the top surfaces of the conductor 240a and the conductor 240b may be on the same surface as the top surface of the insulator 281.

The insulator 241a is provided in contact with an inner wall of the opening formed in the insulator 281, the insulator 274, the insulator 280, and the insulator 254; and the conductor 240a is formed in contact with a side surface of the insulator 241a. The conductor 242a is located in at least part of the bottom portion of the opening, and the conductor 240a is in contact with the conductor 242a. Similarly, the insulator 241b is provided in contact with an inner wall of the opening formed in the insulator 281, the insulator 274, the insulator 280, and the insulator 254; and the conductor 240b is formed in contact with a side surface of the insulator 241b. The conductor 242b is located in at least part of the bottom portion of the opening, and the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure.

In the case where the conductor 240 has a stacked-layer structure, a conductive material having a function of inhibiting the permeation of impurities such as water and hydrogen is preferably used for a conductor in contact with the oxide 230a, the oxide 230b, the conductor 242, the insulator 254, the insulator 280, the insulator 274, the insulator 281, and the like. For example, tantalum, tantalum nitride, titanium, titanium nitride, ruthenium, ruthenium oxide, or the like is preferably used. The conductive material having a function of inhibiting the permeation of impurities such as water and hydrogen may be used as a single layer or stacked layers. The use of the conductive material can prevent oxygen added to the insulator 280 from being absorbed by the conductor 240a and the conductor 240b. In addition, entry of impurities such as water and hydrogen from the layers above the insulator 281 into the oxide 230 through the conductor 240a and the conductor 240b can be inhibited.

An insulator that can be used as the insulator 254 and the like is used as the insulator 241a and the insulator 241b, for example. Since the insulator 241a and the insulator 241b are provided in contact with the insulator 254, entry of impurities such as water and hydrogen from the insulator 280 and the like into the oxide 230 through the conductor 240a and the conductor 240b can be inhibited. Furthermore, oxygen contained in the insulator 280 can be prevented from being absorbed by the conductor 240a and the conductor 240b.

Although not illustrated, a conductor functioning as a wiring may be positioned in contact with the top surface of the conductor 240a and the top surface of the conductor 240b. For the conductor functioning as a wiring, a conductive material containing tungsten, copper, or aluminum as its main component is preferably used. The conductor may have a stacked-layer structure such as a stacked layer structure of the conductive material and titanium or titanium nitride. Note that the conductor may be formed to be embedded in an opening provided in an insulator.

<Constituent Material of Semiconductor Device>

Constituent materials that can be used for a semiconductor device will be described below.

<<Substrate>>

As a substrate which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (for example, an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the above semiconductor substrate, such as an SOI (Silicon On Insulator) substrate. Examples of the conductor substrate include a graphite substrate, a metal substrate, an alloy substrate, a conductive resin substrate, and the like. Alternatively, a substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<<Insulator>>

As an insulator, an insulating oxide, an insulating nitride, an insulating oxynitride, an insulating nitride oxide, an insulating metal oxide, an insulating metal oxynitride, an insulating metal nitride, and the like is used.

When scaling down and high integration of a transistor progress, problems such as leakage current or the like may arise because a gate insulator becomes thinner. When a high-k material is used for the insulator functioning as a gate insulator, the voltage when the transistor operates can be reduced while keeping the physical thickness of the gate insulator. Meanwhile, when a material having a low relative permittivity is used for the insulator functioning as an interlayer film, the parasitic capacitance generated between wirings can be reduced. Thus, a material is preferably selected in accordance with the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, and the like.

Furthermore, when a transistor using an oxide semiconductor is surrounded by insulators having a function of inhibiting the permeation of oxygen and impurities such as hydrogen (the insulator 214, the insulator 222, the insulator 254, the insulator 274, and the like), the electrical characteristics of the transistor can be stabilized. As an insulator that has a function of inhibiting the permeation of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, for the insulator having a function of inhibiting the permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

The insulator functioning as a gate insulator is preferably an insulator including a region containing oxygen that is released by heating. When a structure in which silicon oxide or silicon oxynitride including a region containing oxygen that is released by heating is in contact with the oxide 230 is employed, oxygen vacancies included in the oxide 230 can be filled.

<<Conductor>>

For the conductor, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing the metal element as its component; an alloy containing a combination of the metal elements; or the like is preferably used. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, stacked layers of a plurality of conductive layers formed with the above materials may be used. For example, a stacked-layer structure combining a material containing the above metal element and a conductive material containing oxygen may be used. Furthermore, a stacked-layer structure combining a material containing the above metal element and a conductive material containing nitrogen may be used. In addition, a stacked-layer structure combining a material containing the above metal element, a conductive material containing oxygen, and a conductive material containing nitrogen may be used Note that when an oxide is used in the channel formation region of the transistor, a stacked-layer structure combining a material containing the above-described metal elements and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

In particular, for the conductor functioning as the gate electrode, a conductive material containing oxygen and a metal element contained in a metal oxide where the channel is formed is preferably used. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be used for the oxide 230 of the present invention will be described below.

The metal oxide preferably includes at least indium or zinc. In particular, indium and zinc are preferably included. In addition to them, aluminum, gallium, yttrium, tin, or the like is preferably included. One kind or a plurality of kinds selected from boron, titanium, iron, nickel, germanium, zirconium, molybdenum, lanthanum, cerium, neodymium, hafnium, tantalum, tungsten, magnesium, and the like may be included.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single-crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), an amorphous oxide semiconductor, and the like.

The CAAC-OS has c-axis alignment and a crystal structure with distortion in which a plurality of nanocrystals are connected in the a-b plane direction. Note that the distortion refers to a portion where the direction of a lattice arrangement changes between a region with a regular lattice arrangement and another region with a regular lattice arrangement in a region where the plurality of nanocrystals are connected.

A nanocrystal is basically a hexagon but is not limited to a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of the distortion in the CAAC-OS. That is, formation of a crystal grain boundary is inhibited by the distortion of the lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. Meanwhile, in the CAAC-OS, a reduction in electron mobility due to the crystal grain boundary is less likely to occur because it is difficult to observe a clear crystal grain boundary. Furthermore, the crystallinity of a metal oxide might decrease due to entry of impurities, formation of defects, or the like; hence, the CAAC-OS can be said to be a metal oxide having small amounts of impurities and defects (for example, oxygen vacancies). Thus, a metal oxide including a CAAC-OS is physically stable. Therefore, the metal oxide including a CAAC-OS is resistant to heat and has high reliability.

In the nc-OS, a microscopic region (for example, a region greater than or equal to 1 nm and less than or equal to 10 nm, in particular, a region greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) which is a kind of metal oxide containing indium, gallium, and zinc has a stable structure in some cases by being formed as the above-described nanocrystals. In particular, growing the crystals of IGZO in the air tend to be difficult and thus, a stable structure is obtained in some cases when IGZO is formed as smaller crystals (for example, the above-described nanocrystals) rather than larger crystals (here, crystals with a size of several millimeters or several centimeters).

The a-like OS is a metal oxide having a structure between those of the nc-OS and the amorphous oxide semiconductor. The a-like OS contains a void or a low-density region. That is, the a-like OS has low crystallinity compared with the nc-OS and the CAAC-OS.

An oxide semiconductor (metal oxide) can have various structures which show different characteristics. An oxide semiconductor of one embodiment of the present invention may include two or more of the amorphous oxide semiconductor, the polycrystalline oxide semiconductor, the a-like OS, the nc-OS, and the CAAC-OS.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally on characteristics. Therefore, it is preferable to reduce the concentration of an alkali metal or an alkaline earth metal in the metal oxide. Specifically, the concentration of an alkali metal or an alkaline earth metal in the metal oxide obtained by secondary ion mass spectrometry (SIMS) is made to be lower than or equal to $1\times10^{18}$ atoms/cm$^3$, preferably lower than or equal to $2\times10^{16}$ atoms/cm$^3$.

Hydrogen contained in the metal oxide reacts with oxygen bonded to a metal atom to become water, and forms an oxygen vacancy in some cases. Entry of hydrogen into the oxygen vacancy generates an electron serving as a carrier in some cases. Furthermore, bonding of part of hydrogen and oxygen bonded to a metal atom causes generation of an electron serving as a carrier. Thus, a transistor using a metal oxide that contains hydrogen is likely to have normally on characteristics.

Accordingly, hydrogen in the metal oxide is preferably reduced as much as possible. Specifically, the hydrogen concentration of the metal oxide, which is obtained by SIMS, is made lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be imparted.

As a metal oxide used for a semiconductor of a transistor, a thin film having high crystallinity is preferably used. With the use of the thin film, the stability or the reliability of the transistor can be improved. Examples of the thin film include a thin film of a single-crystal metal oxide or a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the CAAC-IGZO, the nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO have high stability to electron beam irradiation compared with the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in a non-conductive state; specifically, the off-state current per micrometer in the channel width of the transistor is in the order of yA/μm ($10^{-24}$ A/μm). For example, a CPU with low power consumption utilizing a characteristic of a low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is difficult for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

<Modification Example of Semiconductor Device>

Although FIG. 2 shows the structure example of the semiconductor device including the transistor 200 in which the conductor 242 functioning as a source electrode or a drain electrode is formed in contact with the oxide 230, the structure of the semiconductor device is not limited thereto. An example of a semiconductor device including a transistor 200A of one embodiment of the present invention is described below using FIG. 5.

Figure 5A:
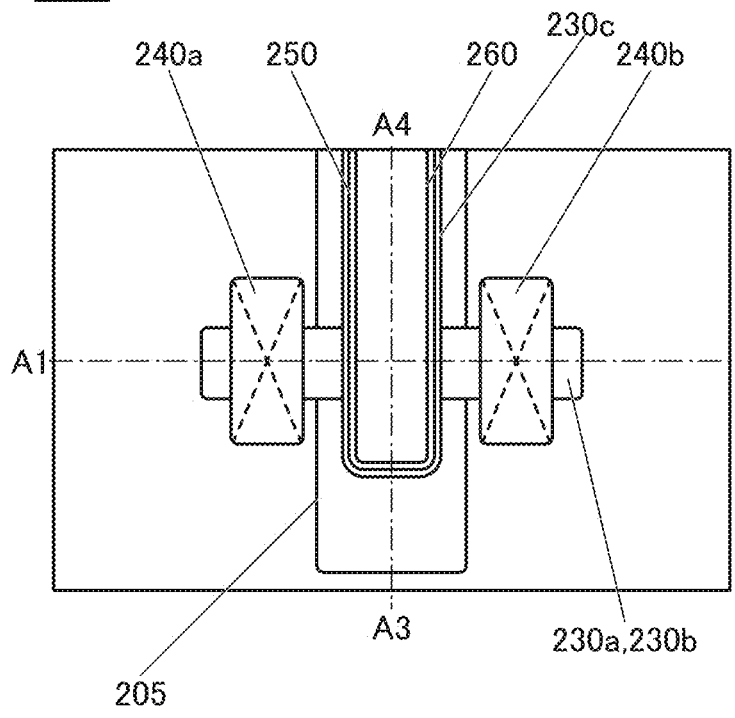
FIGS. 5A-5C A top view and cross-sectional views illustrating a structure example of a semiconductor device of one embodiment of the present invention.
Figure 5C:
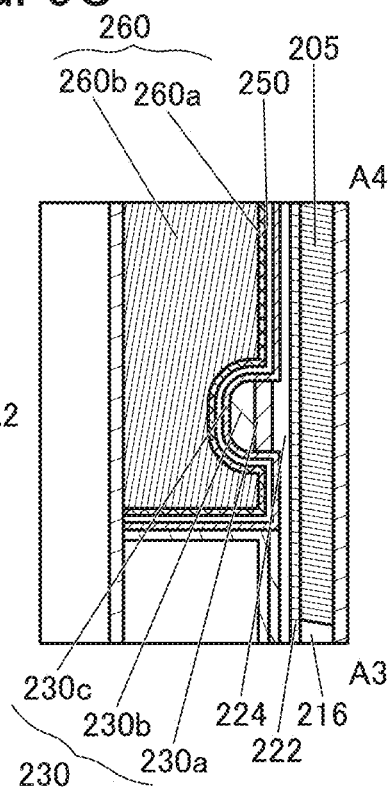
Figure 5B:
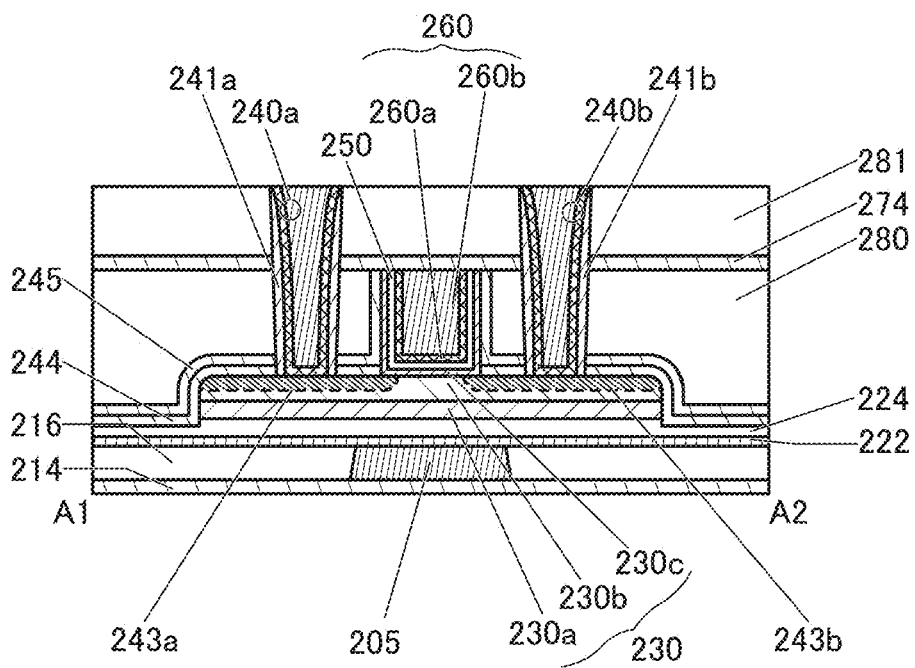

FIG. 5(A) is a top view of the semiconductor device including the transistor 200A. FIG. 5(B) and FIG. 5(C) are cross-sectional views of the semiconductor device. Here, FIG. 5(B) is a cross-sectional view of a portion indicated by a dashed-dotted line A1-A2 in FIG. 5(A), and is a cross-sectional view of the transistor 200A in the channel length direction. FIG. 5(C) is a cross-sectional view of a portion indicated by a dashed-dotted line A3-A4 in FIG. 5(A), and is a cross-sectional view of the transistor 200A in the channel width direction. Note that for clarification of the drawing, some components are not illustrated in the top view in FIG. 5(A).

Note that in the semiconductor device illustrated in FIG. 5, structures having the same functions as the structures configuring the semiconductor device described in <Structure example of semiconductor device> are denoted by the same reference numerals.

The structure of the semiconductor device is described below using FIG. 5. Note that the materials described in detail in <Structure example of semiconductor device> can also be used as constituent materials of the semiconductor devices in this section.

Note that the transistor 200A included in the semiconductor device illustrated in FIG. 5 is a modification example of the transistor 200 included in the semiconductor device described in <Structure example of semiconductor device>. Therefore, differences from the transistor 200 presented in <Structure example of semiconductor device> are mainly described to avoid repeated description.

The transistor 200A illustrated in FIG. 5 is different from the transistor 200 presented in <Structure example of semiconductor device> in that the conductor 242 and the insulator 254 are not included, and an insulator 244 and an insulator 245 are included. In the transistor 200A illustrated in FIG. 5, the conductor 242 is not provided and the resistance of the oxide 230 is selectively reduced so that the oxide 230b is provided with a source region or a drain region.

In the transistor 200A illustrated in FIG. 5, as in the transistor 200 illustrated in FIG. 2, a metal oxide functioning as an oxide semiconductor can be used for the oxide 230 which includes a channel formation region.

When an element that forms an oxygen vacancy or an element that is bonded to an oxygen vacancy is added to the oxide 230, the carrier density is increased and the resistance is reduced in some cases. As the element that reduces the resistance of the oxide 230, boron or phosphorus is typically used. In addition, hydrogen, carbon, nitrogen, fluorine, sulfur, chlorine, titanium, a rare gas, or the like may also be used. Typical examples of rare gas include helium, neon, argon, krypton, xenon, and the like.

Note that the concentration of the element is measured by SIMS or the like.

Boron and phosphorus are particularly preferable because equipment used in a manufacturing line for amorphous silicon or low-temperature polysilicon can be used. The utilization of equipment of the manufacturing line leads to less capital expenditure.

The region 243 (the region 243a and the region 243b) illustrated in FIG. 5 is a region where the above element is added to the oxide 230b. The region 243 can be formed by using a dummy gate, for example.

For example, a dummy gate is provided over the oxide 230b, and using the dummy gate as a mask, an element that reduces the resistance of the oxide 230b is preferably added. That is, the element is added to a region of the oxide 230 that does not overlap with the dummy gate, forming the region 243. Note that as a method of adding the element, an ion implantation method by which an ionized source gas is added with mass separation, an ion doping method by which an ionized source gas is added without mass separation, a plasma immersion ion implantation method, or the like can be used.

Note that an insulator may be provided between the oxide 230b and the dummy gate, and using the dummy gate as a mask, an element that reduces the resistance of the oxide 230b may be added. The same material as that used for the insulator 224 can be used for the insulator, for example.

Next, an insulating film to be the insulator 244 and an insulating film to be the insulator 245 may be deposited over the oxide 230b and the dummy gate. By stacking the insulating film to be the insulator 244 and the insulating film to be the insulator 245, a region where the region 243, the oxide 230c, and the insulator 250 overlap with each other can be provided.

Specifically, after an insulating film to be the insulator 280 is provided over the insulating film to be the insulator 245, the insulating film to be the insulator 280 is subjected to CMP treatment, whereby part of the insulating film to be the insulator 280 is removed and the dummy gate is exposed. Then, when the dummy gate is removed, part of the insulating film to be the insulator 244 in contact with the dummy gate is also preferably removed. Thus, the insulator 245 and the insulator 244 are exposed at the side surface of the opening portion provided in the insulator 280, and at the bottom surface of the opening portion, the region 243 provided in the oxide 230b is partly exposed. After that, an oxide film to be the oxide 230c, an insulating film to be the insulator 250, and a conductive film to be the conductor 260 are formed sequentially in the opening portion. The oxide film to be the oxide 230c, the insulating film to be the insulator 250, and the conductive film to be the conductor 260 are partly removed by CMP treatment or the like until the insulator 280 is exposed, whereby the transistor 200A illustrated in FIG. 5 can be formed.

As the insulator 244 and the insulator 245, an insulator having a function of inhibiting the permeation of oxygen and impurities such as hydrogen is preferably used. Note that the structure does not necessarily require the insulator 244 and the insulator 245. The design is appropriately set in consideration of the required transistor characteristics.

Existing equipment can be used for the transistor 200A illustrated in FIG. 5, and unlike the transistor 200 illustrated in FIG. 2, the conductor 242 is not provided, hence the cost can be reduced.

The structures, methods, and the like described above in this embodiment can be used in combination as appropriate with the structures, methods, and the like described in the other embodiments and examples.

Embodiment 3

In this embodiment, one embodiment of a semiconductor device will be described using FIG. 6 and FIG. 7.
[Memory Device 1]

Figure 6:
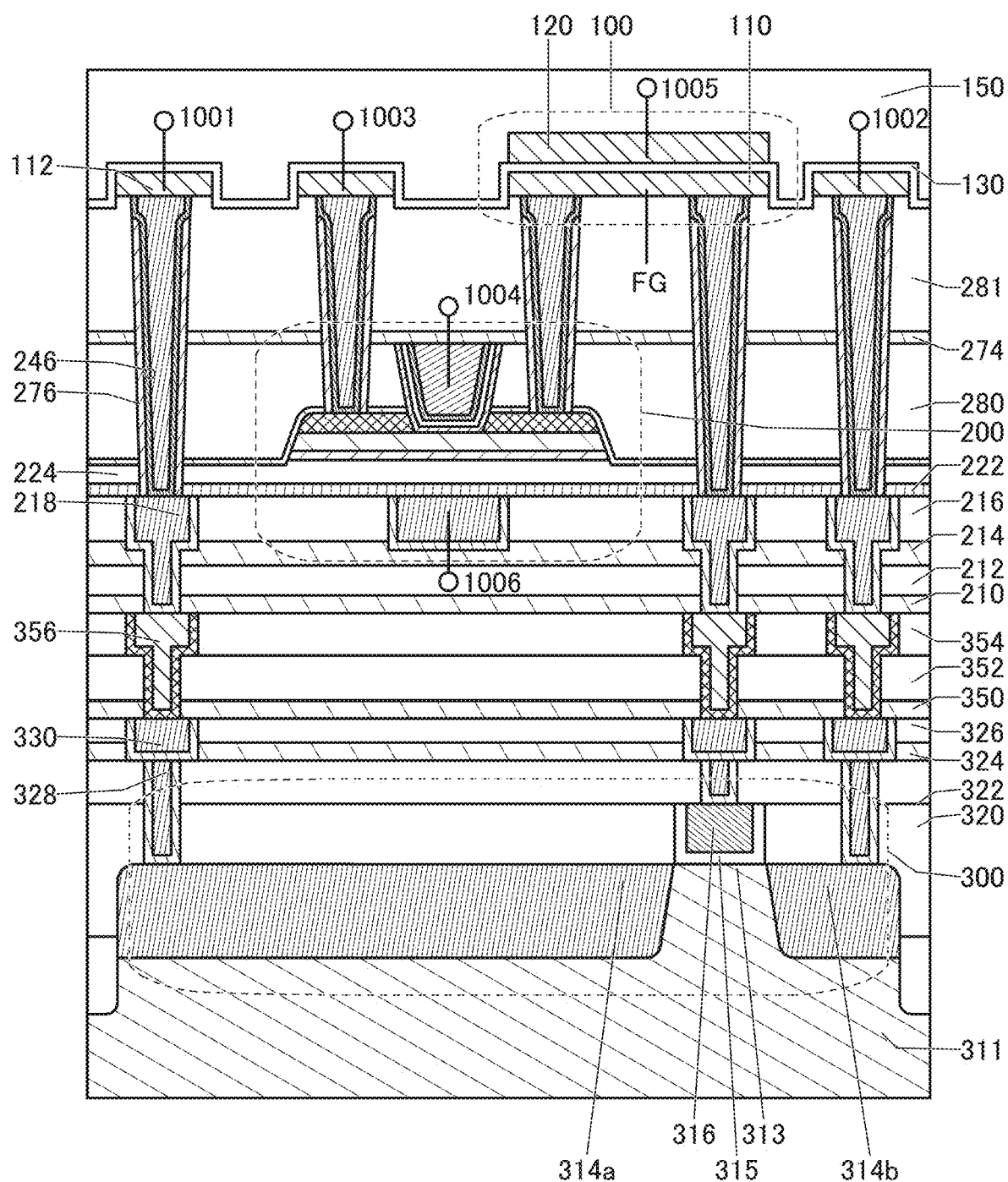
FIG. 6 A cross-sectional view illustrating a structure of a memory device of one embodiment of the present invention.

An example of a semiconductor device (memory device) using a capacitor, which is one embodiment of the present invention, is illustrated in FIG. 6. The semiconductor device of one embodiment of the present invention includes a capacitor 100, the transistor 200, and a transistor 300. The transistor 200 is provided above the transistor 300, and the capacitor 100 is provided above the transistor 300 and the transistor 200. Note that as the transistor 200, the transistor 200 described in the above embodiments can be used.

The transistor 200 is a transistor in which a channel is formed in a semiconductor layer including an oxide semiconductor. Since the off-state current of the transistor 200 is low, using the transistor 200 in a memory device enables stored data to be retained for a long time. In other words, such a memory device does not require refresh operation or the frequency of refresh operation is extremely low, which leads to a sufficient reduction in power consumption of the memory device.

In the semiconductor device illustrated in FIG. 6, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

Furthermore, by arranging the memory devices each of which is shown in FIG. 6 in a matrix, a memory cell array can be formed.

<Transistor 300>

The transistor 300 is provided on a substrate 311 and includes a conductor 316 functioning as a gate electrode, an insulator 315 functioning as a gate insulator, a semiconductor region 313 which is part of the substrate 311, and a low-resistance region 314a and a low-resistance region 314b functioning as a source region or a drain region. The transistor 300 is either a p-channel type or an n-channel type.

Here, in the transistor 300 illustrated in FIG. 6, the semiconductor region 313 (part of the substrate 311) in which the channel is formed has a protruding shape. Furthermore, the conductor 316 is provided to cover a side surface and top surface of the semiconductor region 313 with the insulator 315 positioned therebetween. Note that the conductor 316 may be formed using a material that adjusts the work function. Such a transistor 300 is also referred to as a FIN-type transistor because it utilizes a protruding portion of the semiconductor substrate. An insulator functioning as a mask for forming the protruding portion may be provided in contact with a top portion of the protruding portion. Although the case where the protruding portion is formed by processing part of the semiconductor substrate is described here, a semiconductor film having a protruding shape may be formed by processing an SOI substrate.

Note that the transistor 300 illustrated in FIG. 6 is only an example and the structure is not limited thereto; an appropriate transistor can be used in accordance with a circuit configuration or a driving method.

<Capacitor 100>

The capacitor 100 includes a conductor 110 functioning as a first electrode, a conductor 120 functioning as a second electrode, and an insulator 130 functioning as a dielectric.

For example, the conductor 110 can be formed concurrently with a conductor 112 which is provided over a conductor 246. Note that the conductor 112 has a function of a plug or a wiring that is electrically connected to the capacitor 100, the transistor 200, or the transistor 300.

The conductor 112 and the conductor 110 have a single-layer structure in FIG. 6; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The insulator 130 may be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride, and can be provided as a stacked layer or a single layer.

For example, the insulator 130 preferably has a stacked-layer structure of a material with high dielectric strength such as silicon oxynitride and a material with high permittivity (high-k). With such a structure, in the capacitor 100, a sufficient capacitance can be obtained owing to having an insulator with high permittivity (high-k), and dielectric strength can be improved owing to having an insulator with high dielectric strength, so that the electrostatic breakdown of the capacitor 100 can be inhibited.

Note that insulators that are high permittivity (high-k) materials (high relative permittivity materials) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like.

Materials with high dielectric strength (low relative permittivity materials) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, and the like.

<Wiring Layer>

Wiring layers, each of which an interlayer film, a wiring, a plug, and the like are provided, may be provided between the structure bodies. In addition, a plurality of wiring layers can be provided in accordance with the design. Here, a plurality of conductors having a function of a plug or a wiring are collectively denoted by the same reference numeral in some cases. Furthermore, in this specification and the like, a wiring and a plug electrically connected to the wiring may be a single component. That is, there are cases where part of a conductor functions as a wiring and part of the conductor functions as a plug.

For example, an insulator 320, an insulator 322, an insulator 324, and an insulator 326 are stacked sequentially over the transistor 300 as interlayer films. A conductor 328, a conductor 330, and the like that are electrically connected to the capacitor 100 or the transistor 300 are embedded in the insulator 320, the insulator 322, the insulator 324, and the insulator 326. Note that the conductor 328 and the conductor 330 function as plugs or wirings.

The insulator functioning as an interlayer film function as a planarization film that covers an uneven shape thereunder. For example, a top surface of the insulator 322 may be planarized by planarization treatment using a chemical mechanical polishing (CMP) method or the like to increase planarity.

A wiring layer may be provided over the insulator 326 and the conductor 330. For example, in FIG. 6, an insulator 350, an insulator 352, and an insulator 354 are provided to be stacked sequentially. Furthermore, a conductor 356 is formed in the insulator 350, the insulator 352, and the insulator 354. The conductor 356 functions as a plug or a wiring.

Similarly, the conductor 218, a conductor configuring the transistor 200 (the conductor 205), and the like are embedded in the insulator 210, the insulator 212, the insulator 214, and the insulator 216. Note that the conductor 218 has a function of a plug or a wiring that is electrically connected to the capacitor 100 or the transistor 300. Furthermore, an insulator 150 is provided over the conductor 120 and the insulator 130.

An insulator that can be used as an interlayer film includes the following with insulating properties: an oxide, a nitride, an oxynitride, a nitride oxide, a metal oxide, a metal oxynitride, a metal nitride oxide, and the like.

For example, by using a material with a low relative permittivity for the insulator functioning as an interlayer film, the parasitic capacitance generated between wirings can be reduced. Thus, a material is preferably selected in accordance with the function of an insulator.

For example, as the insulator 150, the insulator 212, the insulator 352, the insulator 354, and the like, an insulator having a low relative permittivity is preferably used. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably include a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (nylon, aramid, or the like), polyimide, polycarbonate, acrylic, and the like.

When the transistor using an oxide semiconductor is surrounded by an insulator that has a function of inhibiting the permeation of oxygen and impurities such as hydrogen, the electrical characteristics of the transistor can be stable. Therefore, an insulator having a function of inhibiting the permeation of oxygen and impurities such as hydrogen is used as the insulator 210, the insulator 350, and the like.

As an insulator having a function of inhibiting the permeation of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, the conductor 328, the conductor 330, the conductor 356, the conductor 218, the conductor 112, and the like may have a single-layer structure or a stacked-layer structure of conductive materials such as a metal material, an alloy material, a metal nitride material, a metal oxide material, and the like which are formed using the above materials. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

<<Wiring or Plug in Layer Provided with Oxide Semiconductor>>

In the case where an oxide semiconductor is used in the transistor 200, an insulator including an excess oxygen region may be provided in the vicinity of the oxide semiconductor. In that case, an insulator having a barrier property is preferably provided between the insulator including the excess oxygen region and a conductor provided in the insulator including the excess oxygen region.

For example, in FIG. 6, an insulator 276 is preferably provided between the insulator 224 including excess oxygen and the conductor 246. Since the insulator 276 is provided in contact with the insulator 222 and the insulator 274, the insulator 224 and the transistor 200 can be sealed by the insulators having barrier properties. Furthermore, the insulator 276 is preferably in contact with the insulator 280. When the insulator 276 extends to the insulator 280, the diffusion of oxygen and impurities can be further inhibited.

That is, provision of the insulator 276 can inhibit the absorption of excess oxygen contained in the insulator 224 by the conductor 246. In addition, by including the insulator 276, the diffusion of hydrogen, which is an impurity, into the transistor 200 through the conductor 246 can be inhibited.

Note that for the insulator 276, an insulating material having a function of inhibiting the diffusion of oxygen and impurities such as water and hydrogen is preferably used. For example, aluminum oxide or hafnium oxide is preferably used. In addition, other insulating materials, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used.

The above is the description of the structure example. With the use of the structure, variation in electrical characteristics can be inhibited and reliability can be improved in a semiconductor device using a transistor including an oxide semiconductor. Alternatively, a transistor including an oxide semiconductor having a high on-state current can be provided. Alternatively, a transistor including an oxide semiconductor having a low off-state current can be provided. Alternatively, a semiconductor device with reduced power consumption can be provided.

[Memory Device 2]

Figure 7:
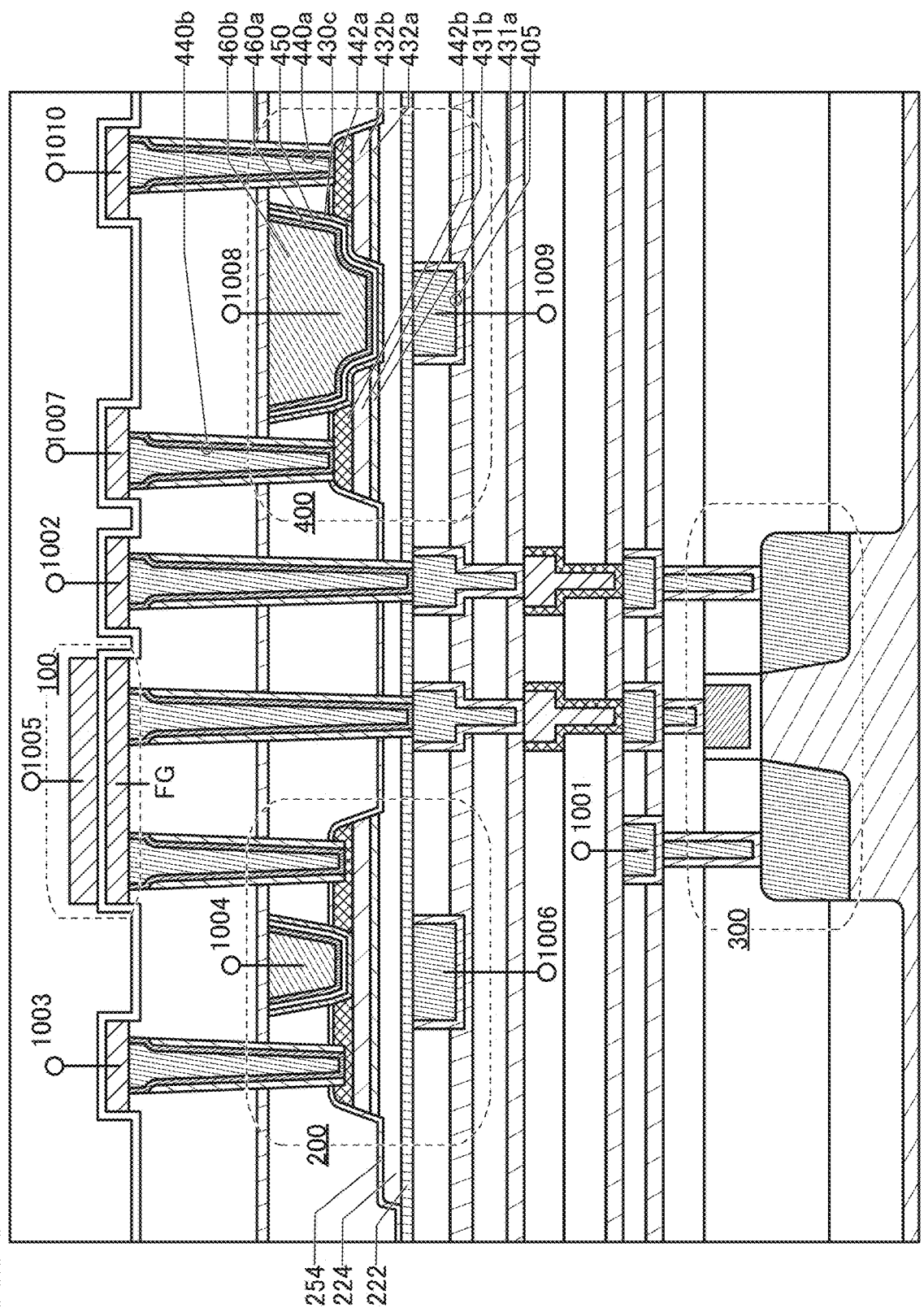
FIG. 7 A cross-sectional view illustrating a structure of a memory device of one embodiment of the present invention.

FIG. 7 illustrates an example of a memory device using the semiconductor device of one embodiment of the present invention. The memory device illustrated in FIG. 7 includes a transistor 400 in addition to the semiconductor device illustrated in FIG. 6 that includes the transistor 200, the transistor 300, and the capacitor 100.

The transistor 400 can control a second gate voltage of the transistor 200. For example, a structure in which a first gate and a second gate of the transistor 400 are diode-connected to a source, and the source of the transistor 400 is connected to the second gate of the transistor 200 is employed. When a negative potential of the second gate of the transistor 200 is retained in this structure, a voltage between the first gate and the source and a voltage between the second gate and the source of the transistor 400 become 0 V. In the transistor 400, a drain current when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored content for a long time.

Hence, in FIG. 7, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the first gate of the transistor 200, and the wiring 1006 is electrically connected to the second gate of the transistor 200. The gate of the transistor 300 and the other of the source and the drain of the transistor 200 are electrically connected to one electrode of the capacitor 100, and the wiring 1005 is electrically connected to the other electrode of the capacitor 100. A wiring 1007 is electrically connected to the source of the transistor 400, a wiring 1008 is electrically connected to a first gate of the transistor 400, a wiring 1009 is electrically connected to a second gate of the transistor 400, and a wiring 1010 is electrically connected to a drain of the transistor 400. Here, the wiring 1006, the wiring 1007, the wiring 1008, and the wiring 1009 are electrically connected.

When the memory devices illustrated in FIG. 7 are arranged in a matrix like the memory devices illustrated in FIG. 6, a memory cell array can be formed. Note that one transistor 400 can control the second gate voltages of a plurality of transistors 200. Thus, the number of the transistor 400 to be provided is preferably smaller than the number of the transistor 200 to be provided.

<Transistor 400>

The transistor 400 and the transistor 200 are formed in the same layer and thus can be fabricated in parallel. The transistor 400 includes a conductor 460 (a conductor 460a and a conductor 460b) functioning as a first gate electrode, a conductor 405 functioning as a second gate electrode, the insulator 222, the insulator 224, and an insulator 450 functioning as gate insulators, an oxide 430c including a channel formation region, a conductor 442a, an oxide 431a and an oxide 431b functioning as one of a source or a drain, a conductor 442b, an oxide 432a and an oxide 432b functioning as the other of the source or the drain, and a conductor 440 (a conductor 440a and a conductor 440b).

In the transistor 400, the conductor 405 is formed in the same layer as the conductor 205. The oxide 431a and the oxide 432a are formed in the same layer as the oxide 230a, and the oxide 431b and the oxide 432b are formed in the same layer as the oxide 230b. The conductor 442 is formed in the same layer as the conductor 242. The oxide 430c is formed in the same layer as the oxide 230c. The insulator 450 is formed in the same layer as the insulator 250. The conductor 460 is formed in the same layer as the conductor 260.

Note that the structure bodies formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be further increased, the off-state current can be reduced, and the drain current when the second gate voltage and the first gate voltage are 0 V can be extremely low.

<Dicing Line>

A dicing line (also referred to as a scribe line, a dividing line, or a cutting line in some cases) that is provided when a large-sized substrate is divided into semiconductor elements so that a plurality of semiconductor devices are obtained in a chip form will be described below. Examples of a dividing method include a method in which a groove (a dicing line) for separating the semiconductor elements is formed on the substrate, after which the substrate is cut along the dicing line to be divided (split) into a plurality of semiconductor devices.

Here, for example, as illustrated in FIG. 7, a region in which the insulator 254 and the insulator 222 are in contact with each other is preferably designed to be the dicing line. That is, an opening is provided in the insulator 224 near the region to be the dicing line that is provided in the outer edge of the transistor 400 and the memory cell including a plurality of transistors 200. The insulator 254 is provided to cover a side surface of the insulator 224.

That is, the insulator 222 and the insulator 254 are in contact with each other in the opening provided in the insulator 224. For example, in this instance, the insulator 222 and the insulator 254 may be formed using the same material and the same method. When the insulator 222 and the insulator 254 are formed using the same material and the same method, the adhesion can be increased. For example, an aluminum oxide is preferably used.

With this structure, the insulator 224, the transistor 200, and the transistor 400 can be enclosed with the insulator 222 and the insulator 254. The insulator 222 and the insulator 254 have a function of inhibiting the diffusion of oxygen, hydrogen, and water; thus, even when the substrate is divided into circuit regions where the semiconductor elements of this embodiment are formed and processed into a plurality of chips, the entry and diffusion of impurities such as hydrogen and water from the direction of a side surface of the divided substrate and into the transistor 200 and the transistor 400 can be prevented.

Furthermore, with this structure, excess oxygen in the insulator 224 can be prevented from being diffused to the outside of the insulator 254 and the insulator 222. Accordingly, excess oxygen in the insulator 224 is efficiently supplied to the oxide where the channel of the transistor 200 or the transistor 400 is formed. The oxygen can reduce oxygen vacancies in the oxide where the channel of the transistor 200 or the transistor 400 is formed. Thus, the oxide where the channel of the transistor 200 or the transistor 400 is formed can be an oxide semiconductor having a low density of defect states and stable characteristics. That is, variation in the electrical characteristics of the transistor 200 or the transistor 400 can be reduced and the reliability can be improved.

This embodiment can be implemented in an appropriate combination with any of the structures described in the other embodiments, examples, and the like.

Embodiment 4

In this embodiment, using FIG. 8 and FIG. 9, a memory device (hereinafter referred to as OS memory in some cases) that employs a transistor using an oxide in a semiconductor (hereinafter referred to as OS transistor in some cases), and a capacitor will be described. The OS memory device is a memory device including at least a capacitor and an OS transistor that controls charging and discharging of the capacitor. Since the off-state current of the OS transistor is extremely low, the OS memory device has excellent retention characteristics and can function as a nonvolatile memory.

<Structure Example of Memory Device>

Figure 8A:
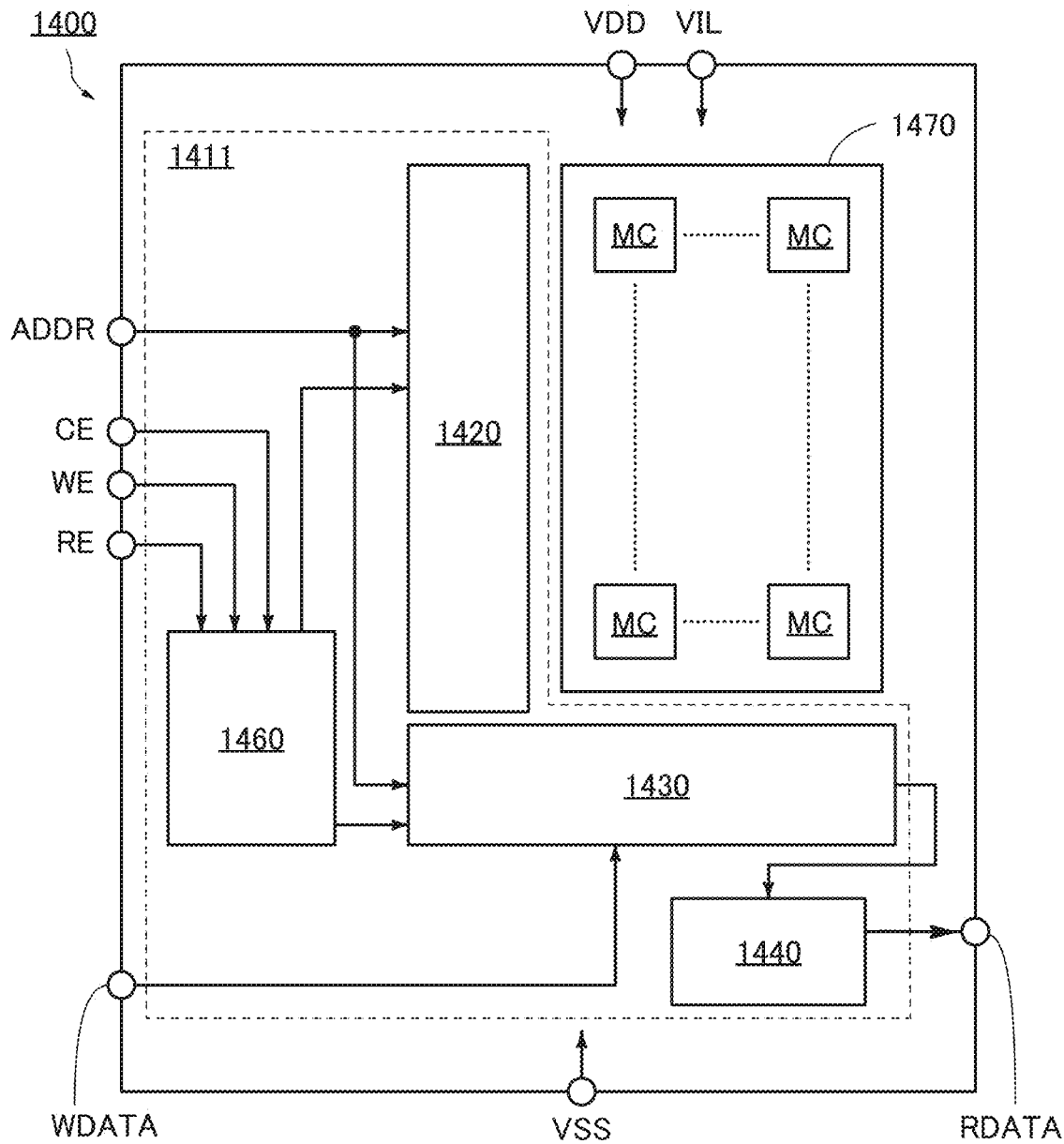
FIGS. 8A-8B A block diagram illustrating a structure example of a memory device of one embodiment of the present invention.

FIG. 8(A) shows a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings are connected to the memory cells included in the memory cell array 1470, which will be described later in detail. The amplified data signal is output to the outside of the memory device 1400 as a data signal RDATA through an output circuit 1440. The row circuit 1420 includes a row decoder and a word line driver circuit, for example, and can select a row to be accessed.

A low power supply voltage (VS S), a high power supply voltage (VDD) for the peripheral circuit 1411, and a high power supply voltage (VIL) for the memory cell array 1470 are supplied to the memory device 1400 as power supply voltages from the outside. Control signals (CE, WE, RE), an address signal ADDR, and a data signal WDATA are input to the memory device 1400 from the outside. The address signal ADDR is input to a row decoder and a column decoder, and the data signal WDATA is input to a write circuit.

The control logic circuit 1460 processes the control signals (CE, WE, RE) from the outside, and generates control signals for the row decoder and the column decoder. The control signal CE is a chip enable signal, the control signal WE is a write enable signal, and the control signal RE is a read-out enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of wirings that connect the memory cell array 1470 and the row circuit 1420 is determined by the configuration of the memory cell MC, the number of memory cells MC in one column, and the like. In addition, the number of wirings that connect the memory cell array 1470 and the column circuit 1430 is determined by the configuration of the memory cell MC, the number of memory cells MC in one row, and the like.

Figure 8B:
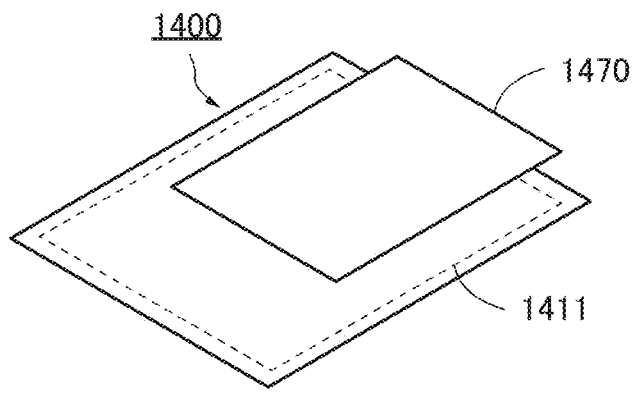

Note that FIG. 8(A) illustrates an example in which the peripheral circuit 1411 and the memory cell array 1470 are formed on the same plane; however, this embodiment is not limited thereto. For example, as illustrated in FIG. 8(B), the memory cell array 1470 may be provided over a part of the peripheral circuit 1411 so that they overlap. For example, a sense amplifier may be provided below the memory cell array 1470 so that they overlap.

A structure example of a memory cell illustrated in FIG. 9 that can be used in the memory cell MC will be described.
[DOSRAM]

Figure 9A:
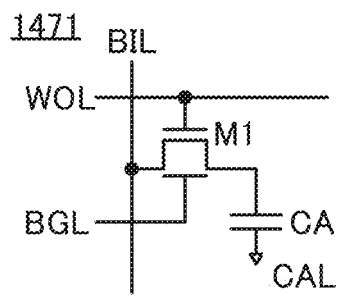
FIGS. 9A-9H Circuit diagrams illustrating structure examples of a memory device of one embodiment of the present invention.
Figure 9B:
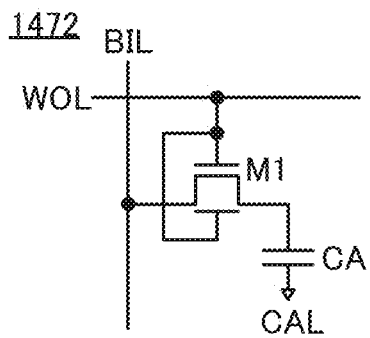
Figure 9C:
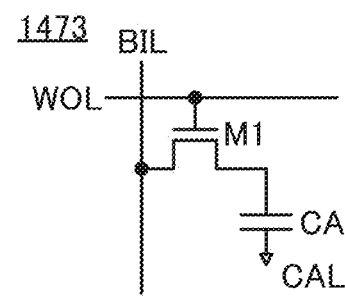
Figure 9D:
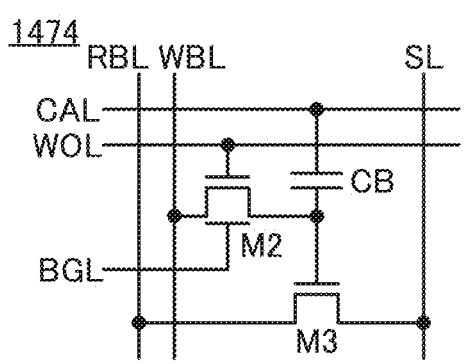
Figure 9E:
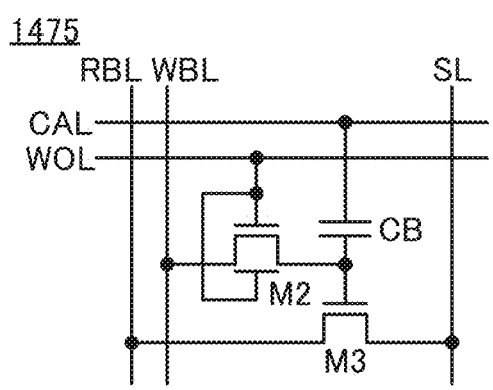
Figure 9F:
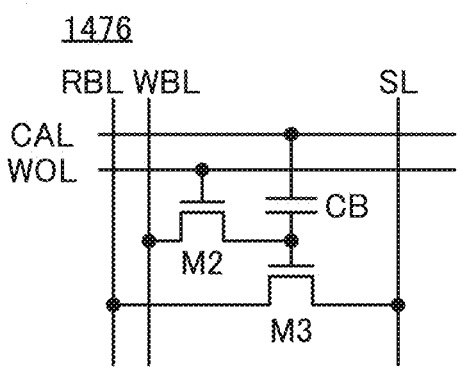
Figure 9G:
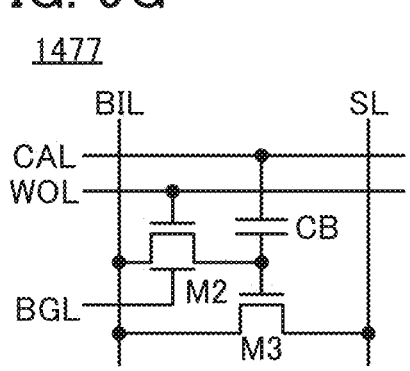

FIGS. 9(A) to 9(C) illustrate a circuit structure example of a memory cell of DRAM. In this specification and the like, a DRAM using a memory cell including one OS transistor and one capacitor is sometimes referred to as DOSRAM (registered trademark) (Dynamic Oxide Semiconductor Random Access Memory). A memory cell 1471 illustrated in FIG. 9(A) includes a transistor M1 and a capacitor CA. Note that the transistor M1 includes a gate (sometimes referred to as a top gate) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471 and its circuit structure can be changed. For example, in the memory cell MC, the back gate of the transistor M1 may be connected to the wiring WOL instead of the wiring BGL as in a memory cell 1472 illustrated in FIG. 9(B). For example, the memory cell MC may be a memory cell configured of a single-gate structure transistor; that is, a transistor M1 that does not have a back gate, as in a memory cell 1473 illustrated in FIG. 9(C).

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of refresh operations for the memory cell can be reduced. In addition, refresh operations of the memory cell can be made unnecessary. Moreover, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap as described above, the bit line can be shortened. This reduces bit line capacitance, which can reduce the storage capacity of the memory cell.
[NOSRAM]

FIGS. 9(D) to 9(G) illustrate a circuit structure example of a gain-cell type memory cell including two transistors and one capacitor. A memory cell 1474 illustrated in FIG. 9(D) includes a transistor M2, a transistor M3, and a capacitor CB. Note that the transistor M2 includes a gate (sometimes referred to as a top gate) and a back gate. In this specification and the like, a memory device including a gain-cell type memory cell using an OS transistor as the transistor M2 is referred to as a NOSRAM (registered trademark) (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The circuit structure of the memory cell MC is not limited to that of the memory cell 1474 and can be changed as appropriate. For example, for the memory cell MC, as in a memory cell 1475 illustrated in FIG. 9(E), a structure in which the back gate of the transistor M2 is connected to the wiring WOL instead of the wiring BGL may be used. For example, the memory cell MC may be a memory cell formed of a transistor with a single-gate structure; that is, a transistor M2 that does not have a back gate, as in a memory cell 1476 illustrated in FIG. 9(F). For example, the memory cell MC may have a structure in which the wiring WBL and the wiring RBL are combined into one wiring BIL as in a memory cell 1477 illustrated in FIG. 9(G).

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be made extremely low. Accordingly, with the use of the transistor M2, written data can be retained for a long time, and thus the frequency of the refresh operations for the memory cell can be reduced. In addition, refresh operations of the memory cell can be made unnecessary. Furthermore, since the leakage current is extremely low, multi-level data or analog data can be retained in the memory cell 1474. The same applies to the memory cells 1475 to 1477.

Note that the transistor M3 may be a transistor with a channel formation region including silicon (hereinafter referred to as a Si transistor in some cases). The conductivity type of the Si transistor may be either n-channel type or p-channel type. The Si transistor has higher field-effect mobility than the OS transistor in some cases. Therefore, a Si transistor may be used as the transistor M3 functioning as a reading transistor. Furthermore, the transistor M2 can be formed over the transistor M3 when a Si transistor is used as the transistor M3, in which case the area of the memory cell can be reduced, leading to higher integration of the memory device.

Furthermore, the transistor M3 may be an OS transistor. When an OS transistor is used in the transistors M2 and M3, a circuit including the memory cell array 1470 using only n-channel transistors can be configured.

Figure 9H:
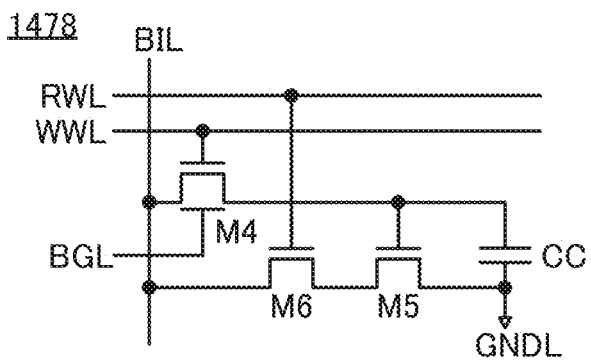

FIG. 9(H) illustrates an example of a gain-cell type memory cell including three transistors and one capacitor. A memory cell 1478 illustrated in FIG. 9(H) includes transistors M4 to M6 and a capacitor CC. The capacitor CC is provided as appropriate. The memory cell 1478 is electrically connected to the wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 does not need to have a back gate.

Note that each of the transistors M5 and M6 may be an n-channel Si transistor or a p-channel Si transistor. Alternatively, the transistors M4 to M6 may be an OS transistor. In that case, a circuit including the memory cell array 1470 using only re-channel transistors can be configured.

In the case where the semiconductor device described in the above embodiment is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to those described above. The arrangements and functions of these circuits and the wirings, circuit components, and the like connected to these circuits can be changed, removed, or added as needed.

The structure described in this embodiment can be used in combination as appropriate with the structures described in the other embodiments, examples, and the like.

Embodiment 5

In this embodiment, an example of a chip 1200 on which a semiconductor device of the present invention is mounted is described using FIG. 10. A plurality of circuits (systems) are mounted on the chip 1200. The technology in which a plurality of circuits (systems) are integrated on one chip is referred to as system on chip (SoC) in some cases.

Figure 10A:
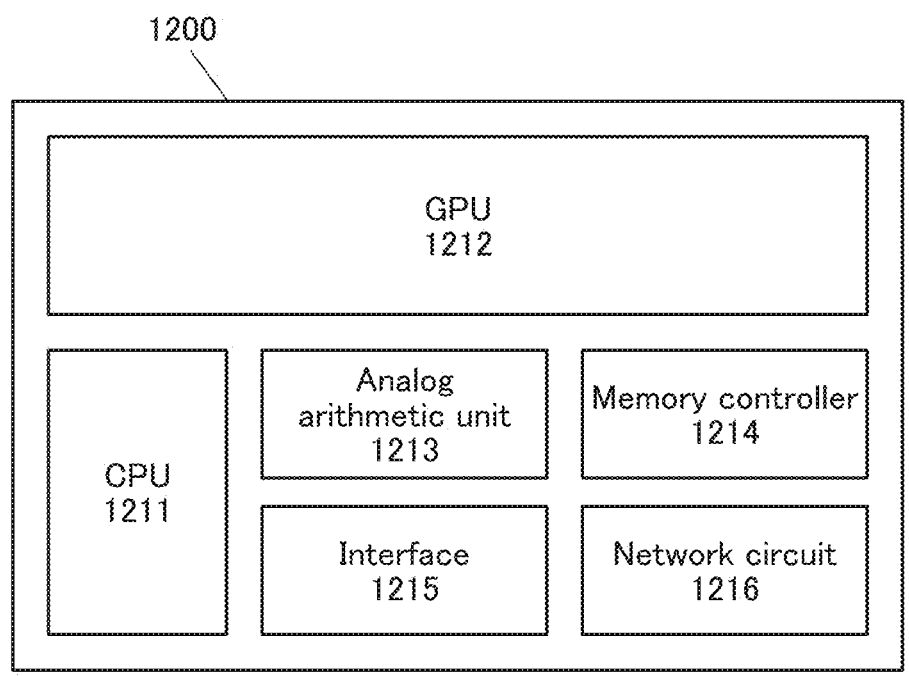
FIGS. 10A-10B Schematic views of a semiconductor device of one embodiment of the present invention.

As illustrated in FIG. 10(A), the chip 1200 includes a CPU (Central Processing Unit) 1211, a GPU (Graphics Processing Unit) 1212, one or a plurality of analog arithmetic units 1213, one or a plurality of memory controllers 1214, one or a plurality of interfaces 1215, one or a plurality of network circuits 1216, and the like.

Figure 10B:
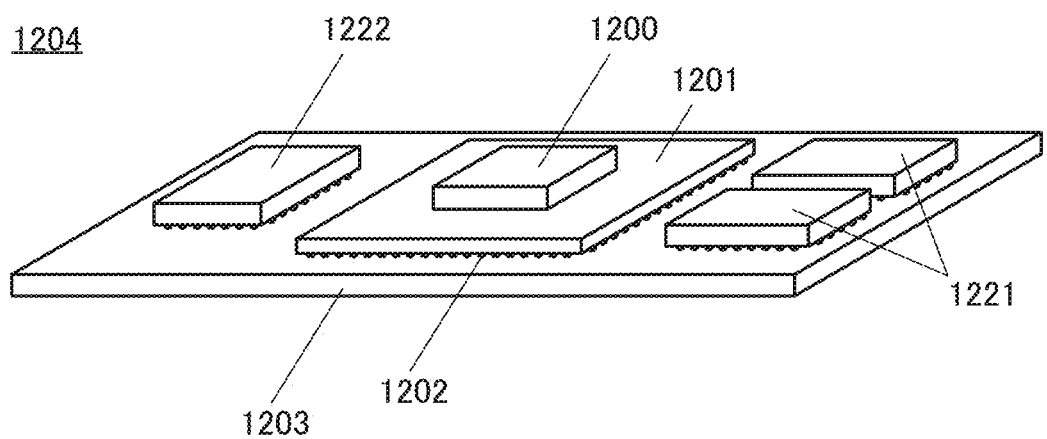

A bump (not illustrated) is provided on the chip 1200, and as illustrated in FIG. 10(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221, a flash memory 1222, and the like may be provided over the motherboard 1203. For example, the DOSRAM described in the above embodiment can be used as the DRAM 1221. For example, the NOSRAM described in the above embodiment can be used as the flash memory 1222.

A CPU 1211 preferably includes a plurality of CPU cores. A GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a large number of data and can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/ analog) converter circuit. Furthermore, the analog arithmetic unit 1213 may include the product-sum operation circuit.

The memory controller 1214 includes a circuit functioning as a controller of the DRAM 1221, and a circuit functioning as the interface of the flash memory 1222.

The interface 1215 includes an interface circuit for an external connection device such as a display device, a speaker, a microphone, a camera, and a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, a circuit for network security may be included.

The circuits (systems) can be formed in the chip 1200 in the same manufacturing process. Therefore, even when the number of circuits needed for the chip 1200 increases, the number of steps in the manufacturing process does not need to be increased, and the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. Furthermore, the GPU module 1204 is excellent in image processing, and thus is suitable for use in a portable electronic device such as a smartphone, a tablet terminal, a laptop PC, or a portable (mobile) game console. Furthermore, the product-sum operation circuit using the GPU 1212 can perform methods such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described above in this embodiment can be used in combination as appropriate with the structures described in the other embodiments, examples, and the like.

Embodiment 6

In this embodiment, application examples of the memory device using the semiconductor device described in the above embodiment will be described. The semiconductor device described in the above embodiment can be applied to, for example, memory devices of a variety of electronic devices (for example, information terminals, computers, smartphones, e-book readers, digital cameras (including video cameras), video recording/reproducing devices, and navigation systems). Here, the computers refer to not only tablet computers, notebook computers, and desktop computers, but also to large computers such as server systems. Alternatively, the semiconductor device described in the above embodiment is applied to a variety of removable memory devices such as memory cards (for example, SD cards), USB memories, and SSDs (Solid State Drives). FIG. 11 schematically illustrates some structure examples of removable memory devices. The semiconductor device described in the above embodiment is processed into a packaged memory chip and used in a variety of storage devices and removable memories, for example.

Figure 11A:
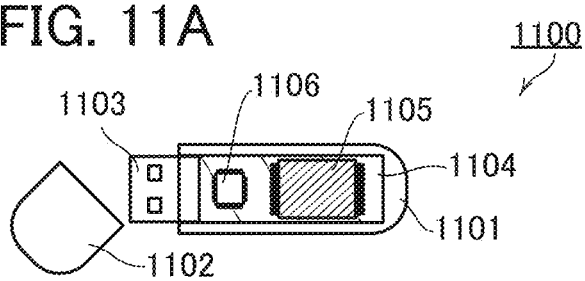
FIGS. 11A-11E Schematic views of a memory device of one embodiment of the present invention.

FIG. 11(A) is a schematic view of a USB memory. A USB memory 1100 includes a housing 1101, a cap 1102, a USB connector 1103, and a substrate 1104. The substrate 1104 is held in the housing 1101. The substrate 1104 is attached with a memory chip 1105 and a controller chip 1106, for example. The semiconductor device described in the above embodiment can be incorporated in the memory chip 1105 or the like.

Figure 11B:
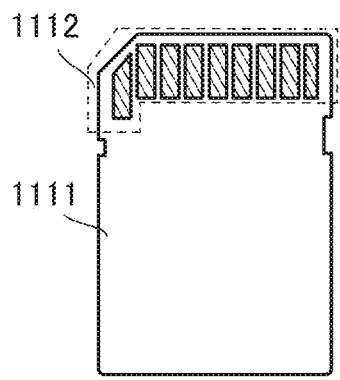
Figure 11C:
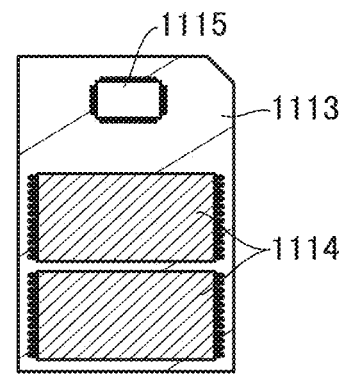

FIG. 11(B) is an external schematic view of an SD card, and FIG. 11(C) is a schematic view of the internal structure of the SD card. An SD card 1110 includes a housing 1111, a connector 1112, and a substrate 1113. The substrate 1113 is held in the housing 1111. The substrate 1113 is attached with a memory chip 1114 and a controller chip 1115, for example. When the memory chip 1114 is also provided on a rear side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the above embodiment can be incorporated in the memory chip 1114 or the like.

Figure 11D:
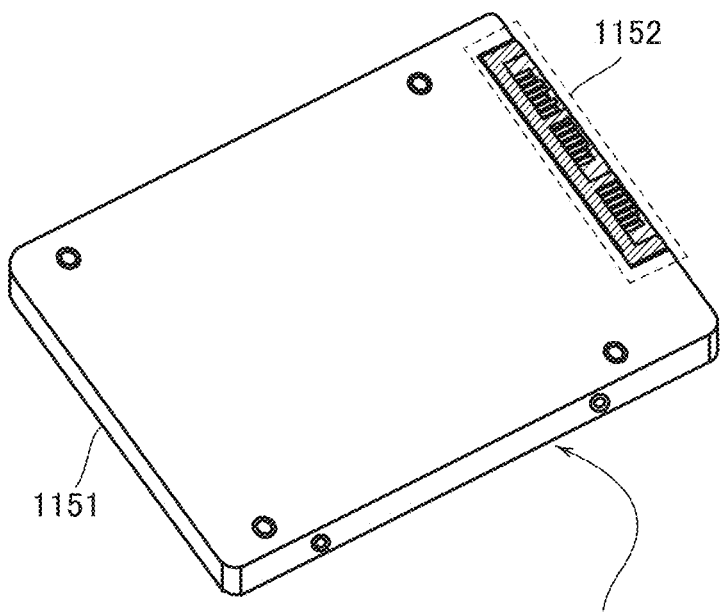
Figure 11E:
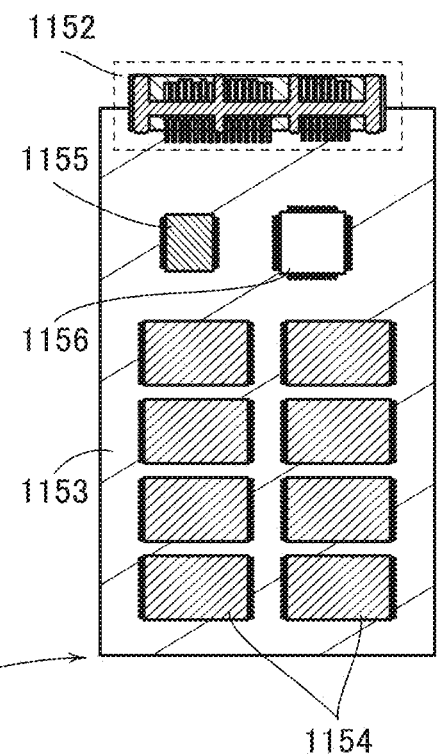

FIG. 11(D) is an external schematic view of an SSD, and FIG. 11(E) is a schematic view of the internal structure of the SSD. An SSD 1150 includes a housing 1151, a connector 1152, and a substrate 1153. The substrate 1153 is held in the housing 1151. The substrate 1153 is attached with a memory chip 1154, a memory chip 1155, and a controller chip 1156, for example. The memory chip 1155 is a work memory of the controller chip 1156, and a DOSRAM chip may be used, for example. When the memory chip 1154 is also provided on a rear side of the substrate 1153, the capacity of the SSD 1150 can be increased. The semiconductor device described in the above embodiment can be incorporated in the memory chip 1154 or the like.

This embodiment can be implemented in an appropriate combination with any of the structures described in the other embodiments, examples, and the like.

Embodiment 7

The semiconductor device of one embodiment of the present invention can be used for processors such as CPUs and GPUs, or chips. FIG. 12 illustrates specific examples of electronic devices including processors such as CPUs and GPUs, or chips of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine such as a pachinko machine. When the integrated circuit or the chip of one embodiment of the present invention is provided in an electronic device, the electronic device can incorporate artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. Examples of the functions include displaying a variety of data (a still image, a moving image, a text image, and the like) on the display portion, a touch panel function, a function of displaying a calendar, date, time, and the like, a function of executing a variety of software (programs), a radio communication function, a function of reading out a program or data stored in a recording medium, and the like. FIG. 12 illustrates examples of electronic devices.

[Mobile Phone]

Figure 12A:
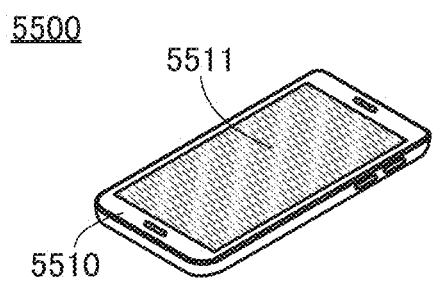

FIG. 12(A) illustrates a mobile phone (smartphone), which is a type of information terminal. An information terminal 5500 includes a housing 5510 and a display portion 5511. As input interfaces, a touch panel is provided in the display portion 5511, and a button is provided in the housing 5510.

The information terminal 5500 can execute an application utilizing artificial intelligence by using the chip of one embodiment of the present invention. Applications utilizing artificial intelligence include, for example, an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal]

Figure 12B:
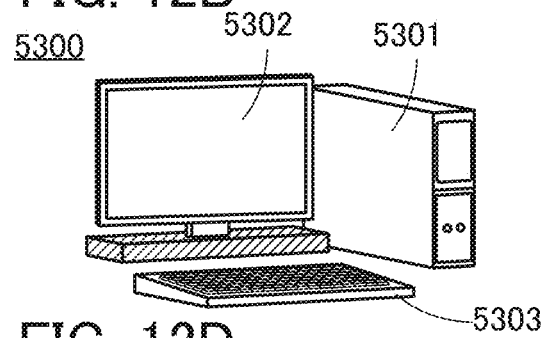

FIG. 12(B) illustrates a desktop information terminal 5300. The desktop information terminal 5300 includes a main body 5301 of the information terminal, a display 5302, and a keyboard 5303.

As in the information terminal 5500 described above, the desktop information terminal 5300 can execute an application utilizing artificial intelligence by using the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, as examples of the electronic devices, a smartphone and a desktop information terminal are shown in FIGS. 12(A) and 12(B), respectively; however, the electronic devices can be information terminals other than a smartphone and a desktop information terminal. Examples of information terminals other than a smartphone and a desktop information terminal include a PDA (Personal Digital Assistant), a laptop information terminal, a workstation, and the like.

[Household Appliance]

Figure 12C:
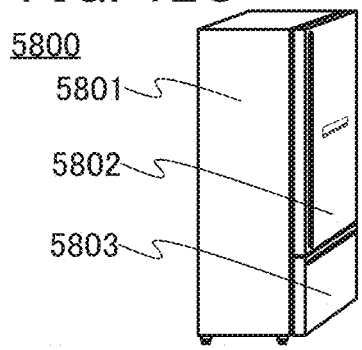

FIG. 12(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example; a function of automatically adjusting the temperature to be appropriate for the foods stored in the electric refrigerator-freezer 5800; and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, an audio visual appliance, and the like.

[Game Machine]

Figure 12D:
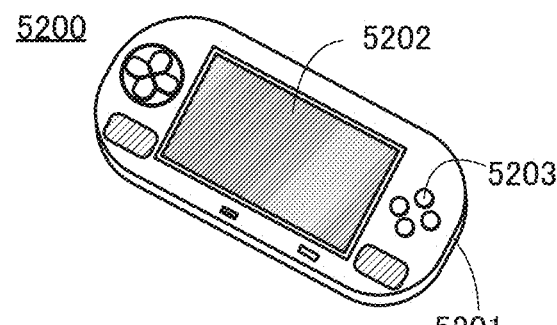
Figure 12D:
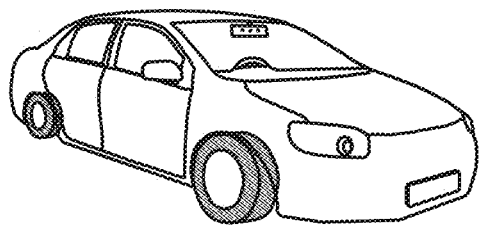
Figure 12D:
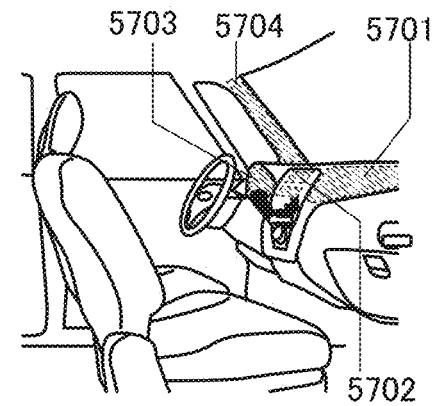

FIG. 12(D) illustrates a portable game machine 5200 as an example of a game machine. The portable game machine includes a housing 5201, a display portion 5202, a button 5203, and the like.

When the GPU or the chip of one embodiment of the present invention is used for the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are determined by the program in the game; however, the use of artificial intelligence in the portable game machine 5200 enables expressions not limited by the game program. For example, an expression in which questions posed by the player, the progress of the game, time, and actions and words of game characters are changed becomes possible.

When a game requiring a plurality of players is played using the portable game machine 5200, the artificial intelligence can create a virtual game player; thus, the game can be played alone with the game player created by the artificial intelligence as an opponent.

Although the portable game machine is illustrated as an example of a game machine in FIG. 12(D), the game machine using the GPU or the chip of one embodiment of the present invention is not limited thereto. Examples of the game machine using the GPU or the chip of one embodiment of the present invention include a stationary home game machine, an arcade game machine installed in entertainment facilities (a game center, an amusement park, and the like), and a pitching machine for batting practice installed in sports facilities.

[Moving Vehicle]

The GPU or the chip of one embodiment of the present invention can be used in an automobile, which is a moving vehicle, and the surroundings of a driver's seat in the automobile.

FIG. 12(E1) illustrates an automobile 5700, which is an example of a moving vehicle, and FIG. 12(E2) is a diagram illustrating the surroundings of a windshield inside the automobile. In FIG. 12(E1), in addition to a display panel 5701, a display panel 5702, and a display panel 5703 that are attached to a dashboard, a display panel 5704 that is attached to a pillar is illustrated.

The display panel 5701 to the display panel 5703 can provide various kinds of information by displaying a speedometer, a tachometer, a mileage, a fuel meter, a gearshift indicator, an air-condition setting, or the like. The content, layout, or the like that are displayed on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 enables compensation for the blind spot and enhancement safety. In addition, showing an image which compensates for the portion that cannot be seen makes it possible to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. In addition, the chip can be used for a system for performing navigation, risk prediction, or the like. The display panel 5701 to the display panel 5704 may have a structure which displays information regarding navigation information, risk prediction, and the like.

Note that although an automobile is described above as an example of a moving vehicle, moving vehicles are not limited to an automobile. Examples of moving vehicles also include a train, a monorail train, a ship, a flying object (a helicopter, an unmanned aircraft (a drone), an airplane, and a rocket), and the like; these moving vehicles can be provided with a system utilizing artificial intelligence when the chip of one embodiment of the present invention is used.

[Broadcasting System]

The GPU or the chip of one embodiment of the present invention can be used in a broadcasting system.

Figure 12F:
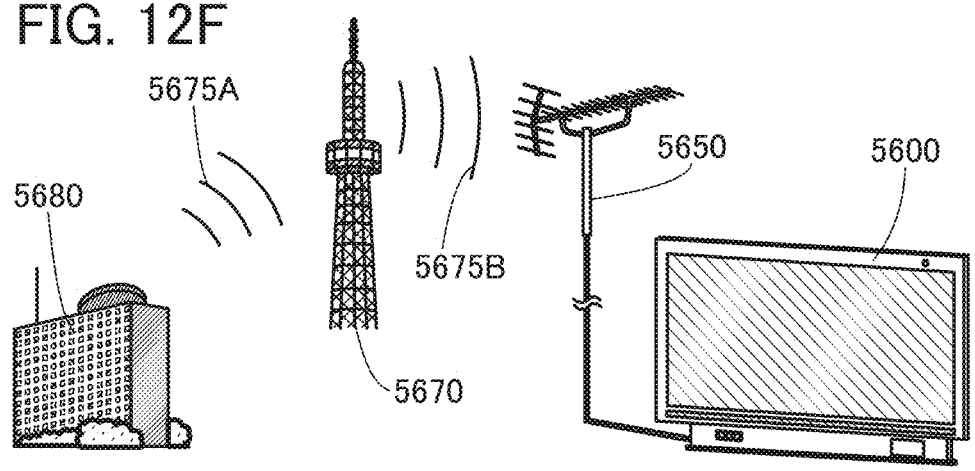

FIG. 12(F) schematically illustrates data transmission in a broadcasting system. Specifically, FIG. 12(F) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 12(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 12(F) and may be satellite broadcasting using an artificial satellite, data broadcasting using an optical line, or the like.

The above broadcasting system may utilize artificial intelligence by using the chip of one embodiment of the present invention. When the broadcast data is transmitted from the broadcast station 5680 to the TV 5600 in each household, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods of the encoder. In-frame prediction utilizing artificial intelligence, for example, can also be performed. In addition, for example, when a broadcast data with low resolution is received and displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K, 8K) broadcasting, in which the broadcast data increases.

As an application of artificial intelligence in the TV 5600, a recording device including artificial intelligence may be provided in the TV 5600, for example. With such a structure, the artificial intelligence in the recording device can learn the user's preference, so that television programs that suit the user's preference can be recorded automatically.

The electronic devices, the functions of the electronic devices, application examples and effects of artificial intelligence, and the like described in this embodiment can be combined as appropriate with the description of another electronic device.

This embodiment can be implemented in an appropriate combination with any of the structures described in the other embodiments, examples, and the like.

EXAMPLE

In this example, a transistor according to one embodiment of the present invention (referred to as Sample A1) was fabricated, and a cross-sectional TEM image in the vicinity of a channel formation region of a metal oxide was obtained. Note that for comparison, Sample A2 and Sample A3 were fabricated with a different manufacturing method from Sample A1, and a cross-sectional TEM image in the vicinity of a channel formation region of a metal oxide was obtained.

Methods for fabricating Sample A1 to Sample A3 are described below. First, a method for fabricating Sample A1 is described.

A silicon oxide film and a first aluminum oxide film were deposited sequentially over a substrate.

Next, a first tungsten film was deposited over the first aluminum oxide film by a sputtering method. Subsequently, the first tungsten film was processed by a lithography method to form a conductor.

Then, a first silicon oxynitride film was deposited over the first aluminum oxide film and the conductor by a CVD method. After that, the first silicon oxynitride film was polished by a first CMP treatment until reaching the top surface of the conductor.

Next, a 5-nm-thick second aluminum oxide film was deposited over the first silicon oxynitride film and the conductor by an ALD method, and a 35-nm-thick second silicon oxynitride film was deposited over the second aluminum oxide film by a CVD method. Then, the second silicon oxynitride film was smoothed by polishing.

Next, an oxide film to be a first oxide and an oxide film to be a second oxide were successively deposited. Next, as the oxide film to be the first oxide, a 5-nm-thick In—Ga—Zn oxide was deposited by a sputtering method. The oxide film to be the first oxide was deposited under the following conditions: an In—Ga—Zn oxide target with In:Ga:Zn=1:3:4 [atomic ratio] was used, the oxygen gas flow rate was 45 sccm, the pressure was 0.7 Pa, and the substrate temperature was 200° C.

As the oxide film to be the second oxide, a 20 nm-thick In—Ga—Zn oxide film was deposited by a sputtering method. The oxide film to be the second oxide was deposited under the following conditions: an In—Ga—Zn oxide target with In:Ga:Zn=4:2:4.1 [atomic ratio] was used, the argon gas flow rate was 30 sccm, the oxygen gas flow rate was 15 sccm, the pressure was 0.7 Pa, and the substrate temperature was 200° C.

Next, a first heat treatment was performed. As the first heat treatment, a treatment was performed at 400° C. in an atmosphere containing nitrogen for one hour, and subsequently a treatment was performed at 400° C. in an atmosphere containing oxygen for one hour.

Next, a tantalum nitride film was deposited over the oxide film to be the second oxide. Then, the tantalum nitride film, the oxide film to be the first oxide, and the oxide film to be the second oxide were processed to form the first oxide and the second oxide.

Next, a third aluminum oxide film and a third silicon oxynitride film were deposited sequentially. Then, by a second CMP treatment, the top surface of the third silicon oxynitride film was planarized.

Then, the third silicon oxynitride film was processed, and an opening reaching the top surface of the third aluminum oxide film was formed in the third silicon oxynitride film. After that, the third aluminum oxide film and the tantalum nitride film in the opening were partly etched.

Next, as an oxide film to be a third oxide, a 5-nm-thick In—Ga—Zn oxide was deposited by a sputtering method. The oxide film to be the third oxide was deposited under the following conditions: an In—Ga—Zn oxide target with In:Ga:Zn=4:2:4.1 [atomic ratio] was used, the oxygen gas flow rate was 45 sccm, the pressure was 0.7 Pa, and the substrate temperature was 130° C.

Next, a fourth silicon oxynitride film was deposited over the oxide film to be the third oxide by a CVD method, a titanium nitride film was deposited over the fourth silicon oxynitride film, and a second tungsten film was deposited over the titanium nitride film.

Then, by the third CMP treatment, the second tungsten film, the titanium nitride film, the fourth silicon oxynitride film, and the oxide film to be the third oxide were polished until reaching the top surface of the third silicon oxynitride film to form a third oxide.

Through the above steps, Sample A1 was fabricated.

Next, a method for fabricating Sample A2 is described.

A silicon oxide film and a first aluminum oxide film were deposited sequentially over a substrate.

Next, a first silicon oxynitride film was deposited over the first aluminum oxide film by a CVD method. Then, a first tungsten film was deposited by a sputtering method. After that, the first tungsten film was processed by a lithography method to form a first hard mask.

Then, the first silicon oxynitride film was processed using the first hard mask, so that an opening was formed in the first silicon oxynitride film.

Next, a first tantalum nitride film was deposited by a sputtering method, a first titanium nitride film was deposited over the first tantalum nitride film by an ALD method, and a second tungsten film was deposited over the first titanium nitride film by a CVD method.

Next, the second tungsten film, the first titanium nitride film, and the first tantalum nitride film were polished by a first CMP treatment until reaching the top surface of the first silicon oxynitride film, and the first hard mask was removed. Through the above steps, a conductor was formed in the opening of the first silicon oxynitride film.

Next, a 10-nm-thick second silicon oxynitride film was deposited over the first silicon oxynitride film and the conductor by a CVD method, a 20-nm-thick hafnium oxide film was deposited over the second silicon oxynitride film by an ALD method, and a 30-nm-thick third silicon oxynitride film was deposited over the hafnium oxide film by a CVD method.

Next, an oxide film to be a first oxide and an oxide film to be a second oxide were successively deposited. As the oxide film to be the first oxide, a 5-nm-thick In—Ga—Zn oxide was deposited by a sputtering method. The oxide film to be the first oxide was deposited under the same conditions as Sample A1.

Next, as the oxide film to be the second oxide, a 15-nm-thick In—Ga—Zn oxide was deposited by a sputtering method. The oxide film to be the second oxide was deposited under the following conditions: an In—Ga—Zn oxide target with In:Ga:Zn=4:2:4.1 [atomic ratio] was used, the argon gas flow rate was 40 sccm, the oxygen gas flow rate was 5 sccm, the pressure was 0.7 Pa, and the substrate temperature was 130° C.

Then, a first heat treatment was performed. As the first heat treatment, a treatment was performed at 400° C. in an atmosphere containing nitrogen for one hour, and subsequently a treatment was performed at 400° C. in an atmosphere containing oxygen for one hour.

Then, a second tantalum nitride film was deposited over the oxide film to be the second oxide. After that, the second tantalum nitride film, the oxide film to be the first oxide, and the oxide film to be the second oxide were processed to form the first oxide and the second oxide.

Next, as an oxide film to be a third oxide, a 5-nm-thick In—Ga—Zn oxide was deposited by a sputtering method. The oxide film to be the third oxide was deposited under the same conditions as Sample A1. After that, a fourth silicon oxynitride film was deposited over the oxide film to be the third oxide by a CVD method. Then, the oxide film to be the third oxide was processed, so that the third oxide was formed.

Through the above steps, Sample A2 was fabricated.

A method for fabricating Sample A3 is described below. Note that the steps up to forming an opening in a first silicon oxynitride film and forming a conductor in the opening were performed through the same steps as Sample A2.

Next, a 5-nm-thick second silicon oxynitride film was deposited over the first silicon oxynitride film and the conductor by a CVD method, a 10-nm-thick hafnium oxide film was deposited over the second silicon oxynitride film by an ALD method, and a 30-nm-thick third silicon oxynitride film was deposited over the hafnium oxide film by a CVD method.

Next, an oxide film to be a first oxide and an oxide film to be a second oxide were successively deposited. By a sputtering method, as the oxide film to be the first oxide, a 5-nm-thick In—Ga—Zn oxide film was deposited, and as the oxide film to be the second oxide, a 15-nm-thick In—Ga—Zn oxide film was deposited. Note that the oxide film to be the first oxide and the oxide film to be the second oxide were deposited under the same conditions as Sample A1.

Then, first heat treatment was performed. As the first heat treatment, a treatment was performed at 400° C. in an atmosphere containing nitrogen for one hour, and subsequently a treatment was performed at 400° C. in an atmosphere containing oxygen for one hour.

Then, a second tantalum nitride film was formed over the oxide film to be the second oxide. After that, the second tantalum nitride film, the oxide film to be the first oxide, and the oxide film to be the second oxide were processed to form the first oxide and the second oxide.

Next, as an oxide film to be the third oxide, a 5-nm-thick In—Ga—Zn oxide was deposited by a sputtering method. The oxide film to be the third oxide was deposited under the same conditions as Sample A1. After that, a fourth silicon oxynitride film was deposited over the oxide film to be the third oxide by a CVD method. After that, the oxide film to be the third oxide was processed, so that the third oxide was formed.

Through the above steps, Sample A3 was fabricated.

The crystallinity of the oxides of the fabricated Sample A1 to Sample A3 were evaluated. FIG. 13 shows high-resolution TEM images of an oxide that were observed from the direction substantially parallel to the sample surface. The high-resolution TEM image was observed using a spherical aberration corrector function. The high-resolution TEM images were taken using an atomic resolution analytical electron microscope JEM-ARM200F manufactured by JEOL Ltd. by irradiation with an electron beam with an acceleration voltage of 200 kV.

Figure 13C:
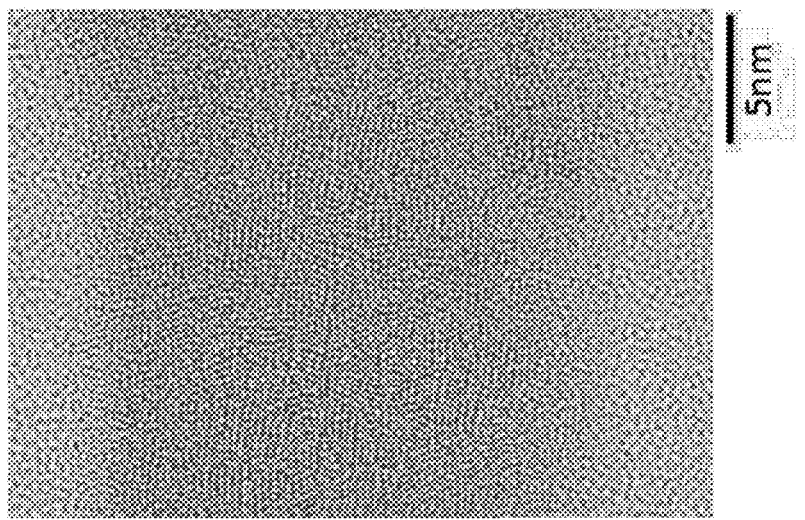
FIGS. 13A-13C High-resolution TEM images of cross-sections of sample A1 to sample A3.
Figure 13B:
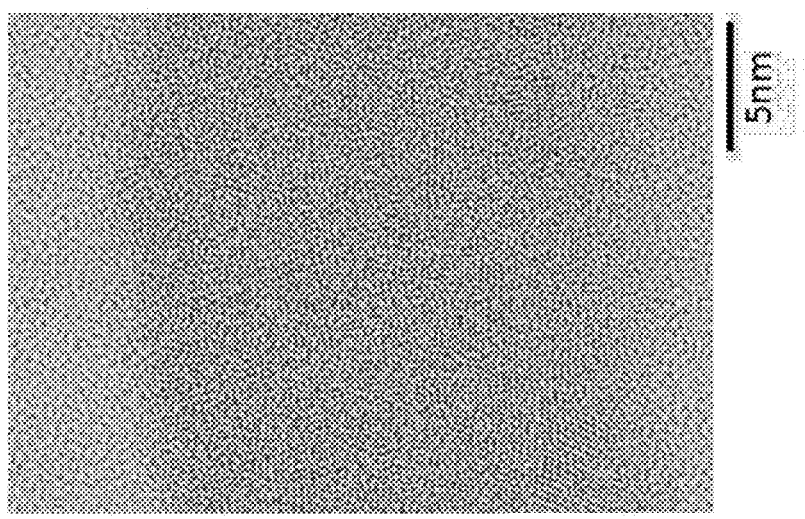
Figure 13A:
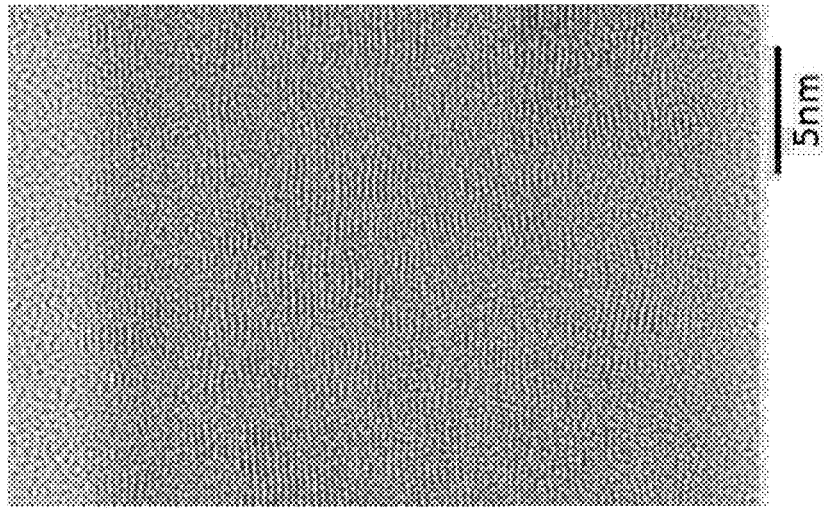

FIG. 13(A) is a TEM image of a cross-section of Sample A1, FIG. 13(B) is a TEM image of a cross-section of Sample A2, and FIG. 13(C) is a TEM image of a cross-section of Sample A3. The bright region observed in the upper region and the lower region in FIG. 13 is a silicon oxynitride film, and the dark region observed near the middle of FIG. 13 is an oxide. Furthermore, in the dark region, the first oxide is positioned in the lower region, the second oxide is positioned at the center, and the third oxide is positioned in the upper region. In FIG. 13(A), a region where a lattice arrangement is aligned from the second oxide to the third oxide was observed in a wide area.

At least part of this example can be implemented in combination with the other embodiments described in this specification as appropriate.

REFERENCE NUMERALS

50: film, 51: film, 52; oxide film, 53: region, 54: region, 100: capacitor, 110: conductor, 112: conductor, 120: conductor, 130: insulator, 150: insulator, 200: transistor, 200A: transistor, 205: conductor, 210: insulator, 212: insulator, 214: insulator, 216: insulator, 218: conductor, 222: insulator, 224: insulator, 230: oxide, 230a: oxide, 230b: oxide, 230c: oxide, 231: region, 231a: region, 231b: region, 234: region, 240: conductor, 240a: conductor, 240b: conductor, 242: conductor, 242a: conductor, 242b: conductor, 241: insulator, 241a: insulator, 241b: insulator, 243: region, 243a: region, 243b: region, 244: insulator, 245: insulator, 246: conductor, 250: insulator, 254: insulator, 260: conductor, 260a: conductor, 260b: conductor, 274: insulator, 276: insulator, 280: insulator, 281: insulator, 283: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 440: conductor, 440a: conductor, 440b: conductor, 442: conductor, 442a: conductor, 442b: conductor, 450: insulator, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring

The invention claimed is:

1. A semiconductor device comprising:
a gate electrode;
a first insulator in contact with a side surface of the gate electrode;
a second insulator in contact with a top surface of the gate electrode and a top surface of the first insulator;
a first oxide over the second insulator; and
a second oxide over and in contact with the first oxide,
wherein each of the first oxide and the second oxide includes a region that overlaps with the gate electrode with the second insulator interposed therebetween,
wherein a maximum height of a roughness curve (Rz) of the top surface of the gate electrode is 6.0 nm or smaller,
wherein the region of the second oxide includes crystals, and
wherein c-axes of the crystals are aligned in a normal direction of the top surface of the gate electrode.

2. The semiconductor device according to claim 1, wherein a mean length of roughness curve components (RSm) of the top surface of the gate electrode is less than 60 nm.

3. The semiconductor device according to claim 1, wherein each of the first oxide and the second oxide comprises indium, zinc, and oxygen.

4. A semiconductor device comprising:
a gate electrode;
a first insulator in contact with a side surface of the gate electrode;
a second insulator in contact with a top surface of the gate electrode and a top surface of the first insulator;
a first oxide over the second insulator; and
a second oxide over and in contact with the first oxide,
wherein each of the first oxide and the second oxide includes a region that overlaps with the gate electrode with the second insulator interposed therebetween,
wherein a mean length of roughness curve components (RSm) of the top surface of the gate electrode is 60 nm or larger,
wherein the region of the second oxide includes crystals, and
wherein c-axes of the crystals are aligned in a normal direction of the top surface of the gate electrode.

5. The semiconductor device according to claim 4, wherein each of the first oxide and the second oxide comprises indium, zinc, and oxygen.

6. A semiconductor device comprising:
a gate electrode;
a first insulator in contact with a side surface of the gate electrode;
a second insulator in contact with a top surface of the gate electrode and a top surface of the first insulator;
a first oxide over the second insulator; and
a second oxide over and in contact with the first oxide,
wherein each of the first oxide and the second oxide includes a region that overlaps with the gate electrode with the second insulator interposed therebetween,
wherein an arithmetical mean height of roughness curves (Ra) of the top surface of the gate electrode is 0.5 nm or smaller,
wherein the region of the second oxide includes crystals, and
wherein c-axes of the crystals are aligned in a normal direction of the top surface of the gate electrode.

* * * * *